(12) United States Patent
Audet

(10) Patent No.: US 10,359,457 B2
(45) Date of Patent: *Jul. 23, 2019

(54) METHOD OF SCANNING, ANALYZING AND IDENTIFYING ELECTROMAGNETIC FIELD SOURCES

(71) Applicant: Mathieu Audet, Montreal (CA)

(72) Inventor: Mathieu Audet, Montreal (CA)

(73) Assignee: 9224-5489 Quebec Inc., Montreal, Quebec (CA)

(*) Notice: Subject to any disclaimer, the term of this patent is extended or adjusted under 35 U.S.C. 154(b) by 1234 days.

This patent is subject to a terminal disclaimer.

(21) Appl. No.: 13/798,431

(22) Filed: Mar. 13, 2013

(65) Prior Publication Data

US 2014/0039821 A1    Feb. 6, 2014

Related U.S. Application Data

(63) Continuation of application No. 12/618,739, filed on Nov. 15, 2009.

(60) Provisional application No. 61/115,066, filed on Nov. 15, 2008.

(51) Int. Cl.
  *G01R 29/08*    (2006.01)
  *G01T 1/02*    (2006.01)

(52) U.S. Cl.
  CPC ..... *G01R 29/0814* (2013.01); *G01R 29/0857* (2013.01); *G01R 29/0871* (2013.01); *G01T 1/02* (2013.01); *G01T 1/026* (2013.01)

(58) Field of Classification Search
  CPC ............ G01R 29/0857; G01R 29/0814; G01R 29/0871; G01T 1/026; G01T 1/02
  See application file for complete search history.

(56) References Cited

U.S. PATENT DOCUMENTS

| | | | |
|---|---|---|---|
| 4,277,744 A | 7/1981 | Audone | |
| 5,099,127 A | 3/1992 | Hiroshi et al. | |
| 5,543,779 A * | 8/1996 | Aspesi | G01R 23/173 |
| | | | 340/539.26 |
| 5,592,148 A | 1/1997 | Morales | |

(Continued)

FOREIGN PATENT DOCUMENTS

| WO | WO2008/083385 | 7/2008 |
|---|---|---|
| WO | WO2008083385 | 7/2008 |

OTHER PUBLICATIONS

Statistics How to, http://www.statisticshowto.com/extrapolation/, p. 1.*

(Continued)

*Primary Examiner* — Sujoy K Kundu
*Assistant Examiner* — L. Anderson
(74) *Attorney, Agent, or Firm* — Mathieu Audet

(57) ABSTRACT

A method of determining the energy level of an electromagnetic field (EMF) received from an EMF source (EMFS) and for identifying the EMFS is provided, the method using a plurality of EMF sensing apparatuses to combine data gathered by the apparatuses in order to identify the level and the sources of the EMF at locations over time. Historical and anticipated EMF-related data is used to warn a user of EMF levels above a preset value. Past, current and future anticipated EMF levels are adapted to be displayed on a map. Methods thereof, apparatuses thereof and computer-readable mediums storing the methods are within the scope of the present invention.

9 Claims, 25 Drawing Sheets

(56) References Cited

U.S. PATENT DOCUMENTS

| | | | |
|---|---|---|---|
| 6,150,812 | A | 11/2000 | Pinsky |
| 6,492,957 | B2 | 12/2002 | Carillo |
| 6,859,275 | B2 | 2/2005 | Fateley |
| 6,934,515 | B2 | 8/2005 | Wallach |
| 7,242,176 | B2 | 7/2007 | Thomason |
| 2003/0026356 | A1 | 2/2003 | Brommer |
| 2006/0031301 | A1 | 2/2006 | Hertz |
| 2007/0018807 | A1* | 1/2007 | Craig ..................... G01J 1/00 340/500 |
| 2011/0313651 | A1 | 12/2011 | Roderick et al. |
| 2012/0260204 | A1 | 10/2012 | Audet |

OTHER PUBLICATIONS https://momographs,iarc.fr/ENG/Monographs/vol80/mono80-6A.pdf, Sources, Exposure and Exposure Assessment, Jul. 1, 2008, pp. 51-93.*

Hughes et al., In-Flight Radio Frequency Spectrum Measurement of Commercial Aircraft Cabins, Sep. 2006, Natinal Technical Information Service, DOT/FAA/AR-06/41—http://www.tc.fa.gov/ots/worldplace/techrpt/ar06-41.pdf.

Chang, Use of Error Coding and Antenna Diversity to Improve Performance of Sub-band Coding, 1998, IEEE pp. 153-157.

* cited by examiner

METHOD OF SCANNING, ANALYZING AND IDENTIFYING ELECTROMAGNETIC FIELD SOURCES

CROSS-REFERENCE

This United States non-provisional patent application relates to, is a continuation application and claims priority from U.S. patent Ser. No. 12/618,739, filed Nov. 15, 2009, entitled METHOD OF SCANNING, ANALYZING AND IDENTIFYING ELECTROMAGNETIC FIELD SOURCES, which relates to and claims priority from U.S. provisional patent No. 61/115,066, filed Nov. 15, 2008, entitled METHOD, SYSTEM AND APPARATUS FOR SCANNING, IDENTIFYING AND ANALYSING THE ENERGY LEVEL RECEIVED FROM EMF SOURCES, which are incorporated herein by reference in their entireties. Any publication of and any patent issuing from the foregoing U.S. patent application is hereby incorporated herein by reference. Furthermore, the disclosure of the priority provisional application is contained in the Appendix hereto, which is incorporated herein by reference.

FIELD OF THE INVENTION

The present invention generally relates to a method for determining the energy level received from EMF sources. More particularly, the present invention relates to a method for monitoring the EMF exposure affecting an individual during his life activities. Additionally, the present invention relates to a method for combining data from a plurality of EMF sensors. Further, the present invention relates to a system and an apparatus adapted to carry out the method.

BACKGROUND

The presence of many electrical devices in our environment is becoming a concern for everybody. Electrical devices generate magnetic and electric fields that can potentially be harmful to the health of humans and other living species. These fields are produced using a number of frequencies and energy levels.

For example, the fields produced by lamps, by toasters or by the electrical wiring in a house are all examples of extremely low frequency fields (ELF) generating devices. These ELF generating devices produce fields of frequencies around 60 Hz in North America and 50 Hz in Europe. On the other hand, computer screen and anti-theft devices are examples of devices generating intermediate frequency (IF). These IF generating devices produce fields of frequencies in the range of about 300 Hz through 10 MHz. Televisions, radio stations and mobile phones are all examples of radio frequency fields (RF) generating devices. These RF generating devices produce fields of frequencies in the range of about 10 MHz through 300 GHz. The effects of these fields depend on the field's strength, the frequency and the level of energy of each field.

The effects on health of these electromagnetic fields (EMF) are the object of many studies. These EMF, depending on their energy level, can induce current in the human body, they can generate heat in the body, they can affect the human DNA, they can affect human cells and they can cause electric shocks among other effects. Other potential harmful health effects include the Alzheimer disease and many types of cancers such as leukemia and brain cancer.

Consequently, many organizations have conducted studies related to the effects of EMF on human health. One of these organizations is the World Health Organization (WHO) that has established a study named: The International EMF project. Previous studies were carried out by WHO like the International Commission on Non-Ionizing Radiation Protection (ICNIRP) which established standard data of electromagnetic fields (EMF) exposition in 1998 that were followed by many countries. Another organization that carries studies is the Institute of Electrical & Electronics Engineers (IEEE) that established standards for EMF exposition in 2002 [IEEE Std C.95.1 for RF and Std. C.95.6 for ELF (2002)].

One issue facing the scientists working on these studies is a lack of data about the long time exposure to the EMF since the increasing presence of high EMF emitters, like mobile phones, is relatively new. Another problem is the identification of the sources of EMF and their associated energy level, since individuals are typically exposed to many types of EMF sources producing many kinds of EMF. In addition, scientists have to take into account the previous health history of the individuals under study. Consequently, the effect on human health of the exposure to EMF is still the object of a number of serious studies. There is therefore a need for a device that will monitor and record data representing the EMF environment of individuals in their daily activities.

In the past, a variety of EMF measuring instruments have been provided in different packages. Such instruments are commonly found in university laboratories and in professional electrician tool kits. Instrument such as spectrum analyzer, radiation dosimeter, Gaussian meter and electric field meter are well known in the art. However, these instruments are not concerned with gathering the results over long period of time. Typically these instruments will provide a measure for the instantaneous value of the current EMF energy level at different frequencies. Moreover, these instruments are typically built to measure one type of frequency range while being poorly adapted or unable, to take measurement at other frequency range. Generally these instruments are too large to be worn by an individual during normal life activities. And typically, these instruments are not concerned with the identification of the source generating the EMF and recording EMF sources data over a period of time. They are also not configured to keep an historical record of the EMF data and even less to associate geographical data therewith.

In light of these reasons, there is a need for a method and a device that provide a history of EMF exposition of an individual. Additionally, there is a need for a device that provides the identification of the source of these fields and the associated energy level thereof. It is also desirable to collect EMF data and store them in a database thus allowing a global analysis of EMF in respect to geographical location and over time.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

An object of the invention provides a method adapted to gather EMF signals encountered by an individual during normal life activities to analyze EMF the EMF signal and find the different EMF sources therein and their respective power. The EMF data is stored and used to provide historical record of EMF sources and their relative respective impact on the individual to correlate health problems of the individual with the EMF that had an effect in its life. The historical data can be shared among many individuals to build a sort of EMF map illustrating the amount of EMF and other EMF data at various locations. Further, based on the EMF data, statistical extrapolations can be made to illustrate the expected amount of EMF at a location in time. The method can be carried out in a plurality of devices like mobile phones or other portable devices.

One object of the invention is to provide a method, a device and a graphical user interface carrying the method, for identifying EMF sources as well as determining the energy level corresponding to each source. The method provides, inter alia, the step of receiving the EMF input signal, the step of separating the EMF input signal into sub-signals, the step of calculating the energy level of each sub-signal and the step of identifying the source of each sub-signal whenever possible. The step of identifying the EMF source may include using different steps such as decoding the sub-signal signature or using a reference database of known sources mapped by their characteristics. A further step of storing EMF data is also provided.

One additional object of the invention is to provide a network configuration of a plurality of EMF sensing instruments, either of the same individual or devices of a group of users, putting in common their data.

One additional aspect of the invention is to provide a storage module adapted to store the data of many EMF sources together with their determined corresponding level of energy in view of facilitating their subsequent identification by an identifying module of an EMF detecting device.

One other object of the invention is to provide an EMF locating module adapted to provides a geographical location associated with detected EMF radiations event.

One other object of the invention is to provide a calendar-clock module adapted to provide a time and date for each detected EMF radiation event.

One other object of the invention is to provide a module adapted to locate EMF sources.

One additional object of the invention is to provide a network arrangement that allows many users to share their information about the EMF sources to generate a global EMF mapping of EMFs at specific locations and over time.

Another object of the invention is to provide a module adapted to interpolate values that include interpolation between different EMF detection events in function of the location of the detected event, interpolation of values in function of time, etc.

One object of the present invention provides a method to record an individual exposition to EMF over time such that it is possible to infer which EMF source(s) had a significant impact.

Another object of the present invention provides a personal portable apparatus adapted to sense EMFs and collect data thereof.

One other object of the present invention provides a network configured to collect EMF data from a plurality of personal portable apparatuses and combine them to provide a general assessment of EMF energy level's state, function of geographical locations and time.

An aspect of the present invention automatically transfers EMF data to the network when the EMFDD has collected EMF data and the EMFDD is connected to a network.

One another additional aspect of the present invention provides a personal apparatus adapted to sense EMFs and warn a user/wearer when the sensed EMF reaches a predetermined instantaneous EMF energy level threshold or reaches a predetermined accumulation threshold of EMF energy.

Another aspect of the present invention provides an EMF sensing tool adapted to copy EMFs reaching an individual and configured to keep a record thereof to testimony how much EMF an individual has been in contact with. Moreover, analysis of the sensed EMFs is adapted to determine which EMFs have been the most significant and potentially harmful to the individual.

An aspect of the present invention provides an EMF analyzing tool adapted to extrapolate in time the expected amount of EMFs at a geographical localization.

Another aspect of the invention provides a method for determining the energy level of an electromagnetic field (EMF) received from an EMF source (EMFS) and for identifying the EMFS is provided, the method comprising: receiving an EMF signal, separating the EMF signal into EMF sub-signals; determining, when possible, the energy level of EMF sub-signals; identify, when possible, the EMFS corresponding to the EMF sub-signals; and recording EMF related data.

One other aspect of the present invention provides a device for determining EMF energy level in the environment of an individual and for identifying EMFS thereof, the device comprising: a receiving module adapted to receive an EMF signal; a processing module operatively connected with the receiving module and adapted to separate the received EMF signal into a plurality of EMF sub-signals, the processing module being further adapted to determine an EMF energy level corresponding to at least one of the EMF sub-signals; an identifying module operatively connected with the processing module and adapted to associate, when possible, an electromagnetic field source to its related EMF sub-signal; a location module operatively connected to the processing module and adapted to identify a location associated with the sensed EMF signal; and a storage module adapted to store EMF data thereon.

An additional aspect of the present invention provides a system for determining an energy level of an EMF signal and a corresponding EMF sub-signal received from an EMFS, the system comprising: a plurality of EMFDD connected to a communication network; and at least one server configured to communicate with at least some of the plurality of EMFDD.

One another aspect of the present invention provides a user graphical interface comprising: an area adapted to illustrate the energy level of EMFS in relation with geographical locations.

Other objects, advantages and features will become readily apparent to the people skilled in the art upon reading the following descriptions that makes reference to the accompanying drawings.

BRIEF DESCRIPTION OF THE DRAWINGS

Referring now to the drawings which form a part of this original disclosure.

DESCRIPTION OF EMBODIMENT(S) OF THE INVENTION

The present invention is now described with reference to the Figures. In the following description, for purposes of explanation, numerous specific details are set forth in order to provide a thorough understanding of the present invention. It may be evident, however, that the present invention may be practiced without these specific details. In other instances, structures and devices are shown in block diagram form in order to facilitate describing possible illustrative embodiments of the present invention.

The features provided in this specification mainly relate to principles for detecting electromagnetic fields energy levels and the electromagnetic fields frequencies present in an individual's environment and is concerned with identifying the electromagnetic fields sources 905 causing electromagnetic fields expositions. This specification also covers computer softwares/applications and machine-readable codes/instructions adapted to detect, identify and display electromagnetic field data associated with electromagnetic radiation and exposition for a period of time. These codes/instructions are preferably stored on a machine-readable medium to be read and acted upon to with a computer or a machine having the appropriate code/instructions reading capability.

Exemplary Network

Figure 1:
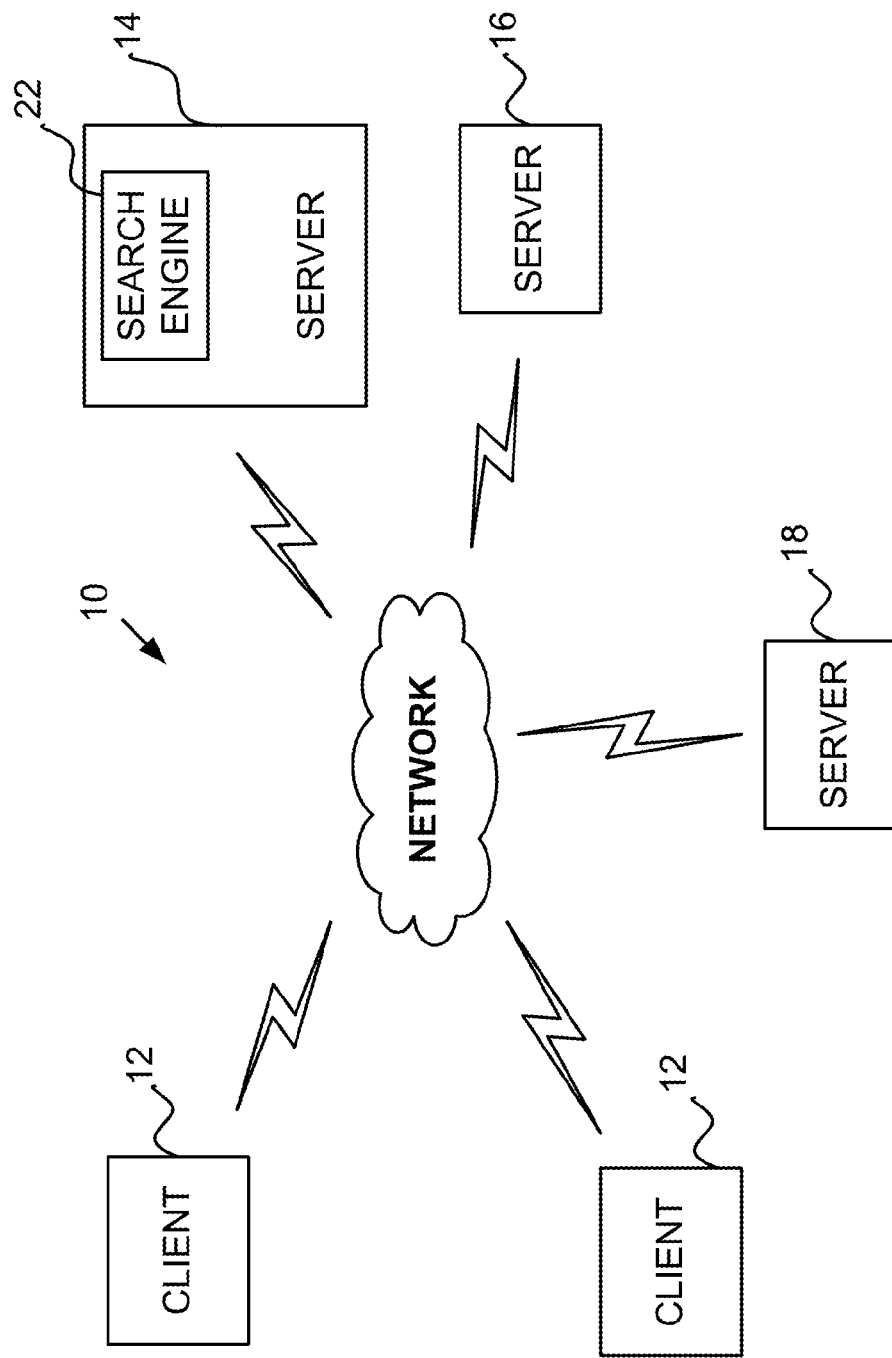
FIG. 1 is an exemplary schematic illustration of a network in accordance with one possible embodiment of the invention.

FIG. 1 illustrates an exemplary network 10 in which a system and method, consistent with the present invention, may be implemented. The network 10 may include multiple client devices 12 connected to multiple servers 14, 16, 18 via a network 20. The network 20 may include a local area network (LAN), a wide area network (WAN), a phone network, such as the Public Switched Phone Network (PSTN), an intranet, the Internet, Wi-Fi, WiMAX or a combination of networks. Two client devices 12 and three servers 14, 16, 18 have been illustrated connected to network 20 for simplicity. In practice, there may be more or less client devices and servers. Also, in some instances, a client device may perform the functions of a server and a server may perform the functions of a client device.

The client devices 12 may include devices, such as mainframes, minicomputers, personal computers, laptops, personal digital assistants, phones, or the like, capable of connecting to the network 20. The client devices 12 may transmit data over the network 20 or receive data from the network 20 via a wired, wireless, or optical connection.

The servers 14, 16, 18 may include one or more types of computer system, such as a mainframe, minicomputer, or personal computer, capable of connecting to the network 20 to enable servers 14, 16, 18 to communicate with the client devices 12. In alternative implementations, the servers 14, 16, 18 may include mechanisms for directly connecting to one or more client devices 12. The servers 14, 16, 18 may transmit data over network 14 or receive data from the network 20 via a wired, wireless, or optical connection.

In an implementation consistent with the present invention, the server 14 may include a search engine 22 usable by the client devices 12. The servers 14 may store documents, such as web pages, accessible by the client devices 12.

Figure 2:
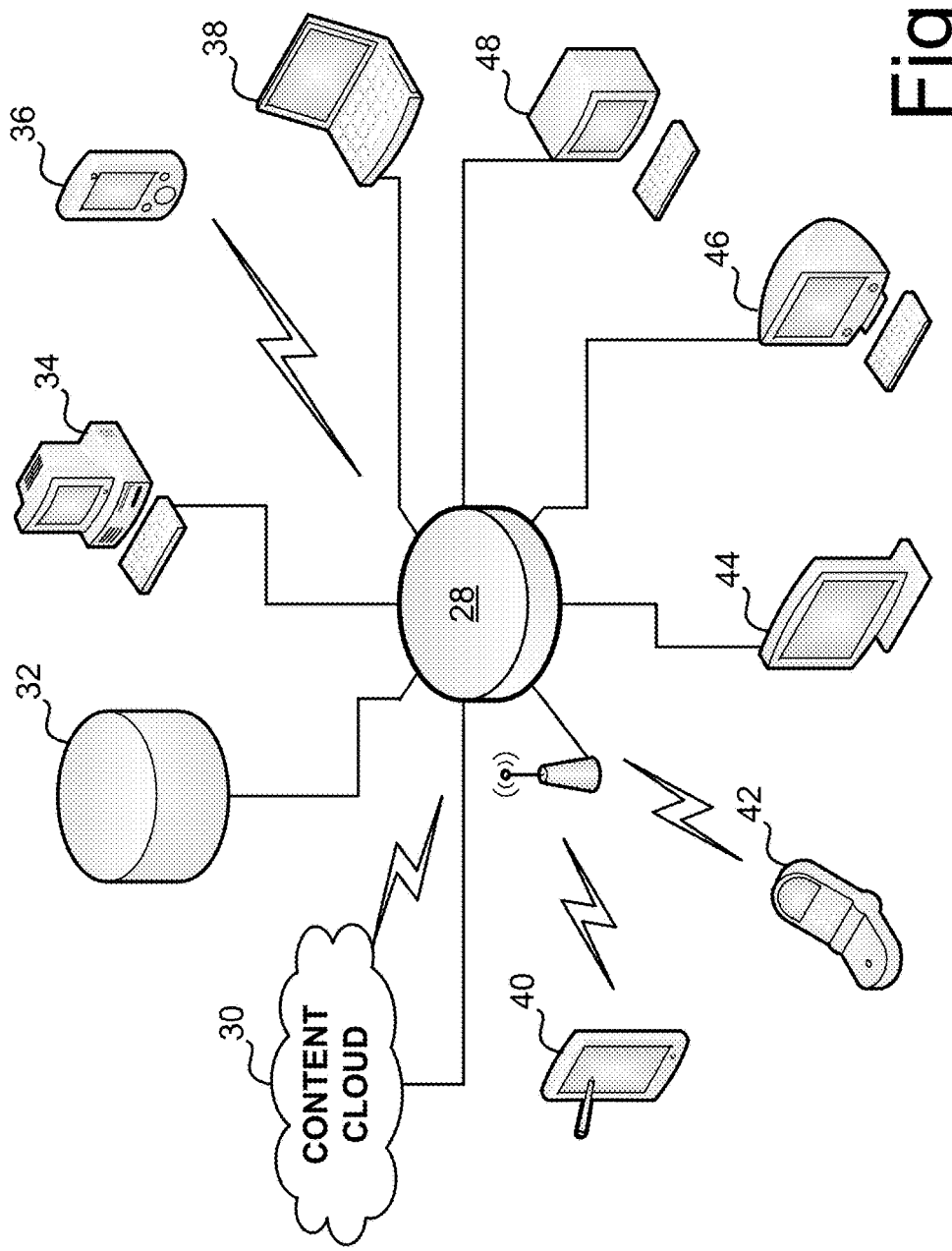
FIG. 2 is an exemplary schematic illustration of a computer network in accordance with one possible embodiment of the invention.

With reference to FIG. 2, a network 20 includes a content cloud 30, a content database 32, content devices 34-38, and devices 40-48. The network mediator 28 enables the network devices 32-38 to communicate with each other without pre-configuring each device. The content cloud 30 represent a content source such as the Internet, where content exists at various distributed locations across the globe and even further like in space. The content includes documents and multimedia content such as audio and video. The mediator 28 allows the content cloud to provide content to devices 40-48. The content database 32 is a storage device that maintains content. The content database 32 may be a stand-alone device on an external communication network. The mediator 28 communicates with the content database 32 to access and retrieve content. The content devices 34-38 include intelligent devices, such as, for example, personal computers, laptops, cell phones and personal digital assistants. The content devices 32-38 are capable or storing content data. The devices 40-48 are intelligent devices that receive content from a content source 30-38. However, the devices 30-38 can also operate as servers to distribute content to other client devices.

Exemplary Client Architecture

The following discussion provides a brief, general description of an exemplary apparatus in which at least some aspects of the present invention may be implemented. The present invention will be described in the general context of computer-executable instructions, such as program modules, being executed by a computerized device. However, the methods of the present invention may be affected by other apparatus. Program modules may include routines, programs, objects, components, data structures, applets, WEB 2.0 type of evolved networked centered applications, etc. that perform a task(s) or implement particular abstract data types. Moreover, these skilled in the art will appreciate that at least some aspects of the present invention may be practiced with other configurations, including hand-held devices, multiprocessor system, microprocessor-based or programmable consumer electronics, network computers, minicomputers, set top boxes, mainframe computers, gaming console and the like. At least some aspects of the present invention may also be practiced in distributed computing environments where tasks are performed by remote processing devices linked through a communications network. In a distributed computing environment, program modules may be located in local and/or remote memory storage devices.

Figure 3:
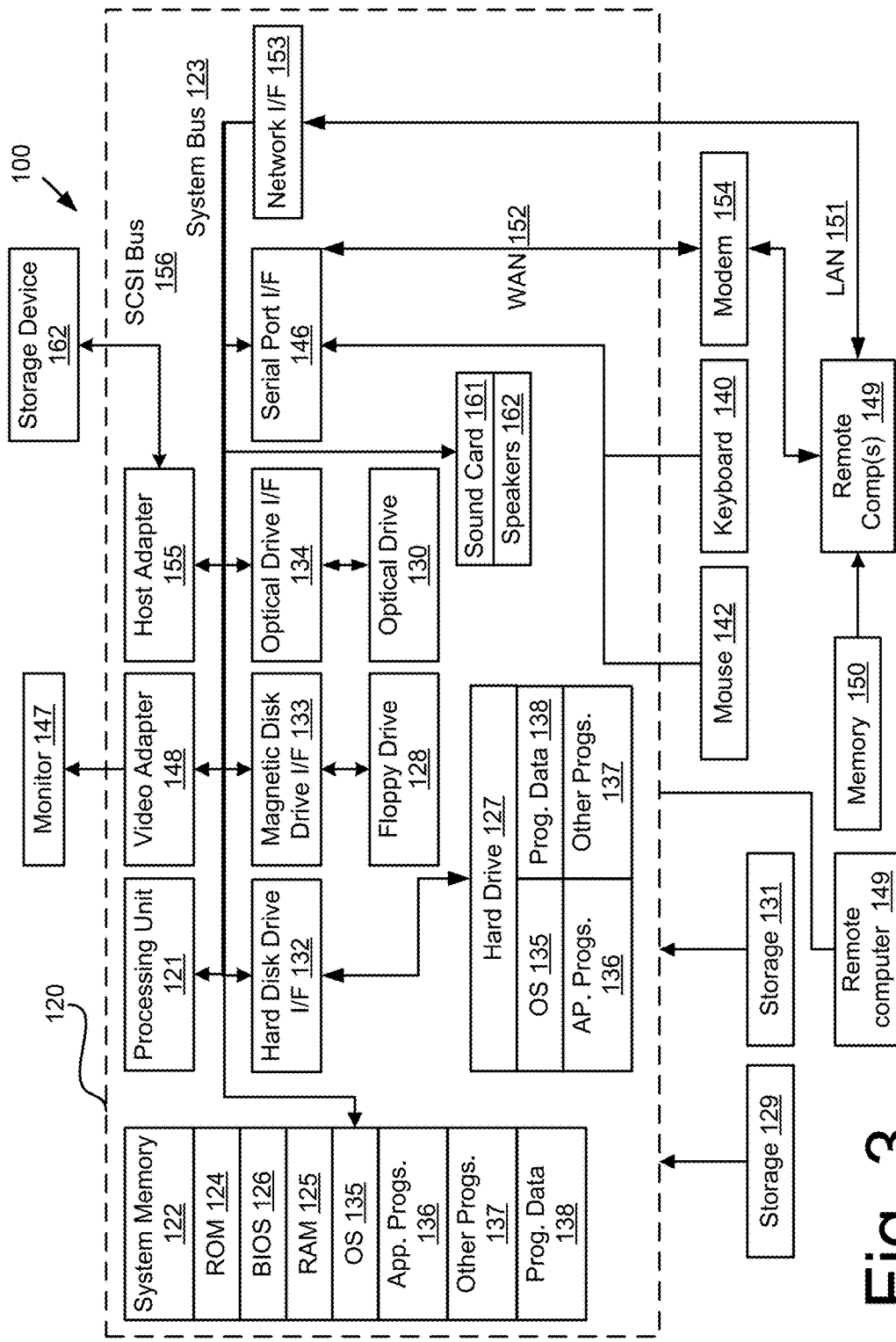
FIG. 3 is an exemplary schematic illustration of a computer system in accordance with one possible embodiment of the invention.

With reference to FIG. 3, an exemplary apparatus 100 for implementing at least some aspects of the present invention includes a general purpose computing device in the form of a conventional personal computer 120 or in the form of a computerized portable apparatus. The computer 120 may include a processing unit 121, a system memory 122, and a system bus 123 that couples various system components, including the system memory 122, to the processing unit 121. The system bus 123 may be any of several types of bus structures including a memory bus or memory controller, a peripheral bus, and a local bus using any of a variety of bus architectures. The system memory may include read only memory (ROM) 124 and/or random access memory (RAM) 125. A basic input/output system 126 (BIOS), containing basic routines that help to transfer data between elements within the personal computer 120, such as during start-up, may be stored in ROM 124. The personal computer 120 may also include a hard disk drive 127 for reading from and writing to a hard disk, (not shown), a magnetic disk drive 128 for reading from or writing to a (e.g., removable) magnetic disk 129, and an optical disk drive 130 for reading from or writing to a removable (magneto) optical disk 131 such as a compact disk or other (magneto) optical media. The hard disk drive 127, magnetic disk drive 128, and (magneto) optical disk drive 130 may be coupled with the system bus 123 by a hard disk drive interface 132, a magnetic disk drive interface 133, and a (magneto) optical drive interface 134, respectively. The drives and their associated storage media provide nonvolatile (or persistent) storage of machine readable instructions, data structures, program modules and other data for the personal computer 120. Although the exemplary environment described herein employs a hard disk, a removable magnetic disk 129 and a removable optical disk 131, these skilled in the art will appreciate that other types of storage media, such as magnetic cassettes, flash memory cards, digital video disks, Bernoulli cartridges, random access memories (RAMs), read only memories (ROM), and the like, may be used instead of, or in addition to, the storage devices introduced above.

A number of program modules may be stored on the hard disk 127, magnetic disk 129, (magneto) optical disk 131, ROM 124 or RAM 125, such as an operating system 135 (for example, Windows NT 4.0, sold by Microsoft Corporation of Redmond, Wash.), one or more application programs 136, other program modules 137 (such as "Alice", which is a research system developed by the User Interface Group at Carnegie Mellon University, OpenGL from Silicon Graphics Inc. of Mountain View Calif., or Direct 3D from Microsoft Corp. of Bellevue Wash.), and/or program data 138 for example.

A user may enter commands and data into the personal computer 120 through input devices, such as a keyboard 140, a camera 141 and pointing device 142 for example. Other input devices (not shown) such as a microphone, joystick, game pad, satellite dish, scanner, a touch sensitive screen, accelerometers adapted to sense movements of the user or movements of a device, or the like may also be included. These and other input devices are often connected to the processing unit 121 through a serial port interface 146 coupled to the system bus. However, input devices may be connected by other interfaces, such as a parallel port, a game port, blue tooth connection or a universal serial bus (USB). For example, since the bandwidth of the camera 141 may be too great for the serial port, the video camera 141 may be coupled with the system bus 123 via a video capture card (not shown). The video monitor 147 or other type of display device may also be connected to the system bus 123 via an interface, such as a video adapter 148 for example. The video adapter 148 may include a graphics accelerator. One or more speaker 162 may be connected to the system bus 123 via a sound card 161 (e.g., a wave table synthesizer such as product number AWE64 Gold Card from Creative® Labs of Milpitas, Calif.). In addition to the monitor 147 and speaker(s) 162, the personal computer 120 may include other peripheral output devices (not shown), such as a printer for example. As an alternative or an addition to the video monitor 147, a stereo video output device, such as a head mounted display or LCD shutter glasses for example, could be used.

The personal computer 120 may operate in a networked environment which defines logical connections to one or more remote computers, such as a remote computer 149. The remote computer 149 may be another personal computer, a server, a router, a network PC, a peer device or other common network node, and may include many or all of the elements described above relative to the personal computer 120, although only a memory storage device has been illustrated in FIG. 3. The logical connections depicted in FIG. 2 include a local area network (LAN) 14 and a wide area network (WAN) 152, an intranet and the Internet.

When used in a LAN, the personal computer 120 may be connected to the LAN 14 through a network interface adapter (or "NIC") 153. When used in a WAN, such as the Internet, the personal computer 120 may include a modem 154 or other means for establishing communications over the wide area network 152 (e.g. Wi-Fi, WinMax). The modem 154, which may be internal or external, may be connected to the system bus 123 via the serial port interface 146. In a networked environment, at least some of the program modules depicted relative to the personal computer 120 may be stored in the remote memory storage device. The network connections shown are exemplary and other means of establishing a communications link between the computers may be used.

The Electromagnetic Fields Detecting Device (EMFDD)

In order to simplify the text we will be hereinafter refer to the Electromagnetic Field Detecting Device as EMFDD. Despite the fact that the EMFDD can do more than merely detecting the electromagnetic field(s) as it will be explained below. In the same manner, the Electromagnetic Fields Source, which provides the EMF fields, will be hereinafter referred to as EMFS. The apparatus adapted to cooperate with the EMFDD will be hereinafter referred to as EMFDA. The electromagnetic fields will be hereinafter referred to as EMF.

The combined signal received by the EMFDD 200 will hereinafter be referred to as the EMF input signal. Each portion of the EMF input signal associated with specific EMFS 905 will hereinafter be referred to as EMF sub-signal. A detection event happens when the EMFDD 200 reads the EMF input signal. The values detected, or calculated in association with a detection event, will be hereinafter referred to as the EMF data. The EMFS 905 data that will be used by the EMFDD 200 to identify the EMFS 905 will hereinafter be referred to as EMFS 905 data. These terms being better defined, lets move on with the description.

Figure 4:
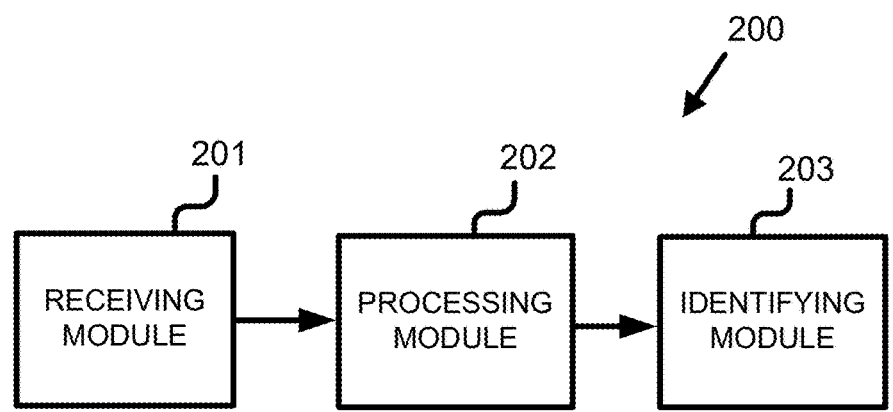
FIG. 4 is an exemplary schematic block diagram of an EMFDD in accordance with one possible embodiment of the invention.

We now refer to FIG. 4, which illustrates one embodiment of the EMFDD 200. The EMFDD 200 comprises a receiving module 201, a processing module 202 and an identifying module 203. The receiving module 201 includes at least one antenna adapted to sense EMF input signals.

Figure 15:
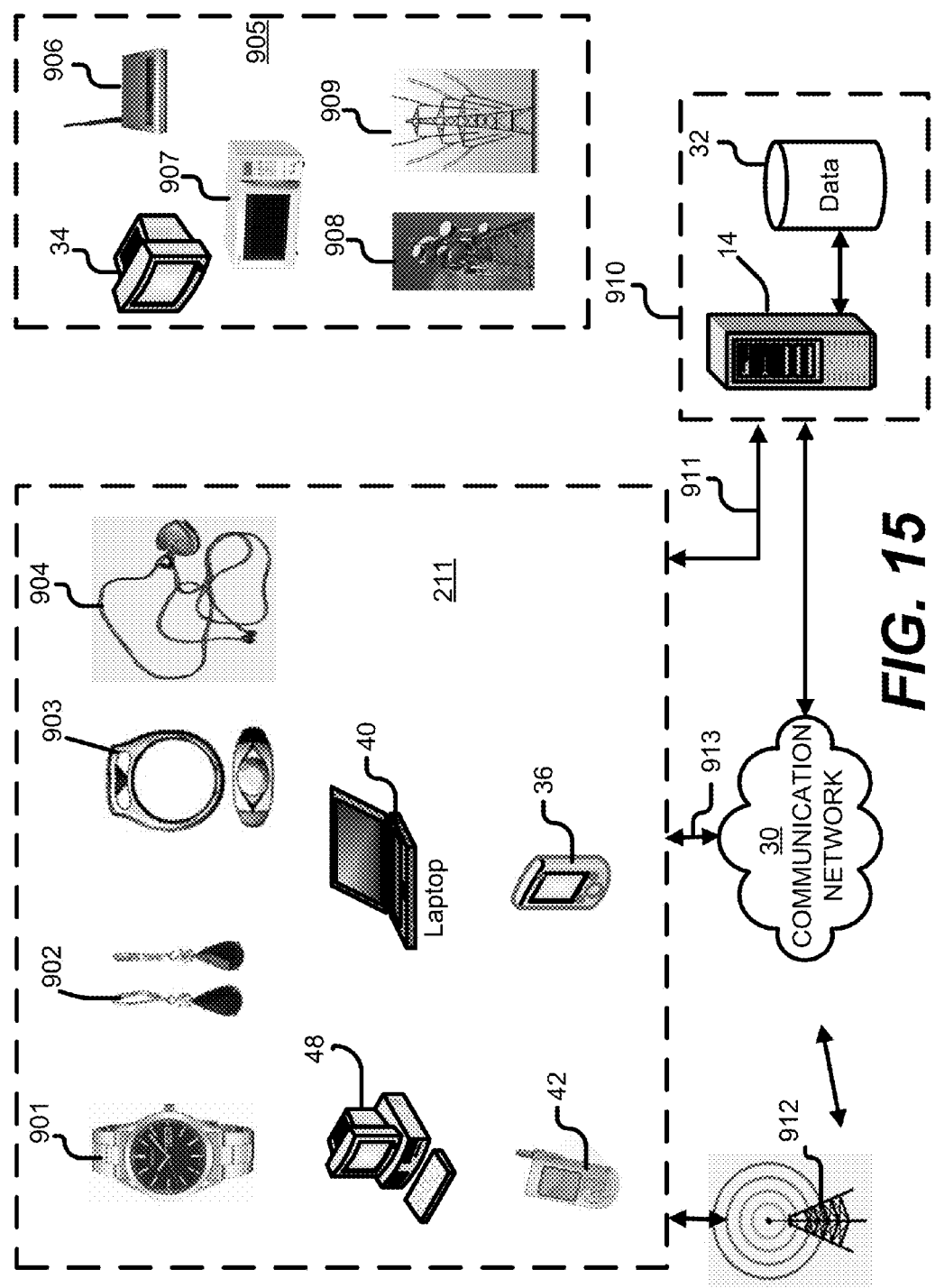
FIG. 15 is an exemplary schematic view of plausible EMFSs and EMFDAs in a networked configuration in accordance with possible embodiments of the invention.

The EMF input signal is a combination of a plurality of EMF sub-signals, each provided by their respective EMFS 905, for which illustrative examples are provided on FIG. 15. The processing module 202 is responsible for segregating the EMF input signal into a plurality of EMF sub-signals and for determining the energy level of each sub-signal. The processing module 202 may be implemented in digital mode or in analogical mode without departing from the scope of the present application.

The energy level for each EMF input sub-signal is typically measured in power density; the unit for power density is the Watt/meter$^2$ (W/m$^2$). The energy level of electric fields is typically measured in linear density Volt/meter (V/m), while the energy level of magnetic fields is typically measured in milligauss (mG). The energy level of the EMF input signal combined may be calculated with the expression given by:

$$\text{Power} = \sum_{i=1}^{N} |S(i)|^2 \qquad \text{Equation 1}$$

Where S(i) represents the amplitude of each sub-signal in Volt (V), where N represents the number of EMF sub-signals, and where Power represents the energy level of the combined EMF input signal. Typically the energy level is provided in decibel (dB) or in dBm.

The identifying module 203 depicted in FIG. 4 receives each sub-signal from the processing module 202 together with the EMF data of each EMF sub-signal. These EMF data include, inter alia, their respective energy level and their respective frequencies. The identifying module 203 is adapted to associate each EMF sub-signal to an EMFS 905 by using those data. In other word, the identification module 203 matches the detected EMF data of each sub-signals with predetermined EMF data representing each EMFS 905. Table 1 that follows illustrates a number of frequencies that represent an indication of the type of detected EMFS 905.

TABLE 1

| Description | Frequency | EMFS |
| --- | --- | --- |
| VLF—Very Low and ELF Extremely Low | 3-30 kHz | Power line, common appliances |
| LF—Low | 30-300 kHz | |
| MF—Medium | 300-3000 kHz | AM, FM radio |
| HF—High | 3-30 MHz | |
| VHF—Very High | 30-300 MHz | Television |
| UHF—Ultrahigh | 300-3000 MHz | Television UHF |
| SHF—Super high | 3-30 GHz | |
| EHF—Extremely High | 30-300 GHz | |
| Infrared (IR) | 1-500 THz | Heat, fire |
| Visible Light | 500-750 THz | Visible object |
| Ultraviolet (UV) | 0.75-100 THz | Sun exposition |
| X-rays | 0.1-10 × 10$^{18}$ Hz | Dentist x-ray |
| Gamma rays | >10 × 10$^{18}$ Hz | Nuclear radiation |

As it can be appreciated from Table 1 above, the frequencies of the detected EMF input sub-signals give a good indication of the type of EMFS 905 that is received. For example, when a sub-signal fundamental frequency is about 60 Hz, the identification of the EMFS 905 as originating from a appliances commonly found around the house or a power line EMFS 905 can be inferred. However, since the identification of the EMFS 905 is made with only one parameter, the identification is provided with a percentage of probability. Initially the EMF data detected will give only an indication about the possible EMFS 905. Eventually, as more EMF data is collected, the identification of the EMFS 905 will be made with a better accuracy and the probability that the identification is correct will significantly increase (perhaps close to 100%).

Alternatively, the identifying module 203 may utilize a digital decoder adapted to decode an electronic signature for each sub-signal in order to identify their respective EMFS 905. For example, the electronic signature identification may include the name of a radio station.

It will become apparent to those skilled in the art that the EMF input signal may also include electric fields alone or magnetic fields alone. The necessary adaptation will therefore be made to the receiving module in order to detect those fields separately.

The EMFDD Associated with or Embedded in an EMFDA

Digital Processing and GPS Location

Figure 5:
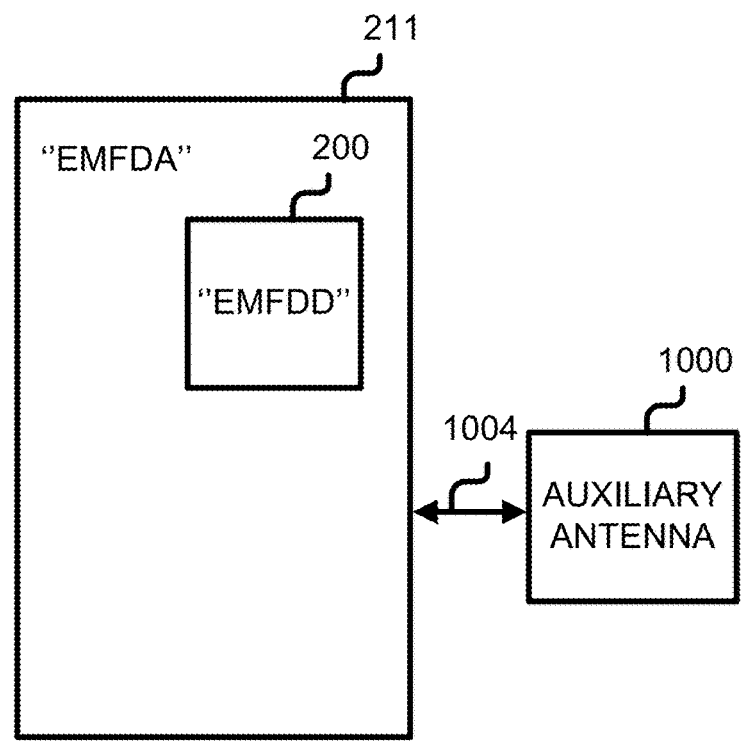
FIG. 5 is an exemplary schematic block diagram of the EMFDD embedded in the EMFDA in accordance with one possible embodiment of the invention.

FIG. 5 illustrates one embodiment of the device according to the present invention, wherein the EMFDD 200 is embedded in an EMFDA 211. Additionally, an auxiliary antenna 1000 (or many auxiliary antennas) may be provided to improve signals reception. Each auxiliary antenna preferably includes at least a connecting module 1004 adapted to establish a communication link with the EMFDA 211.

Figure 6:
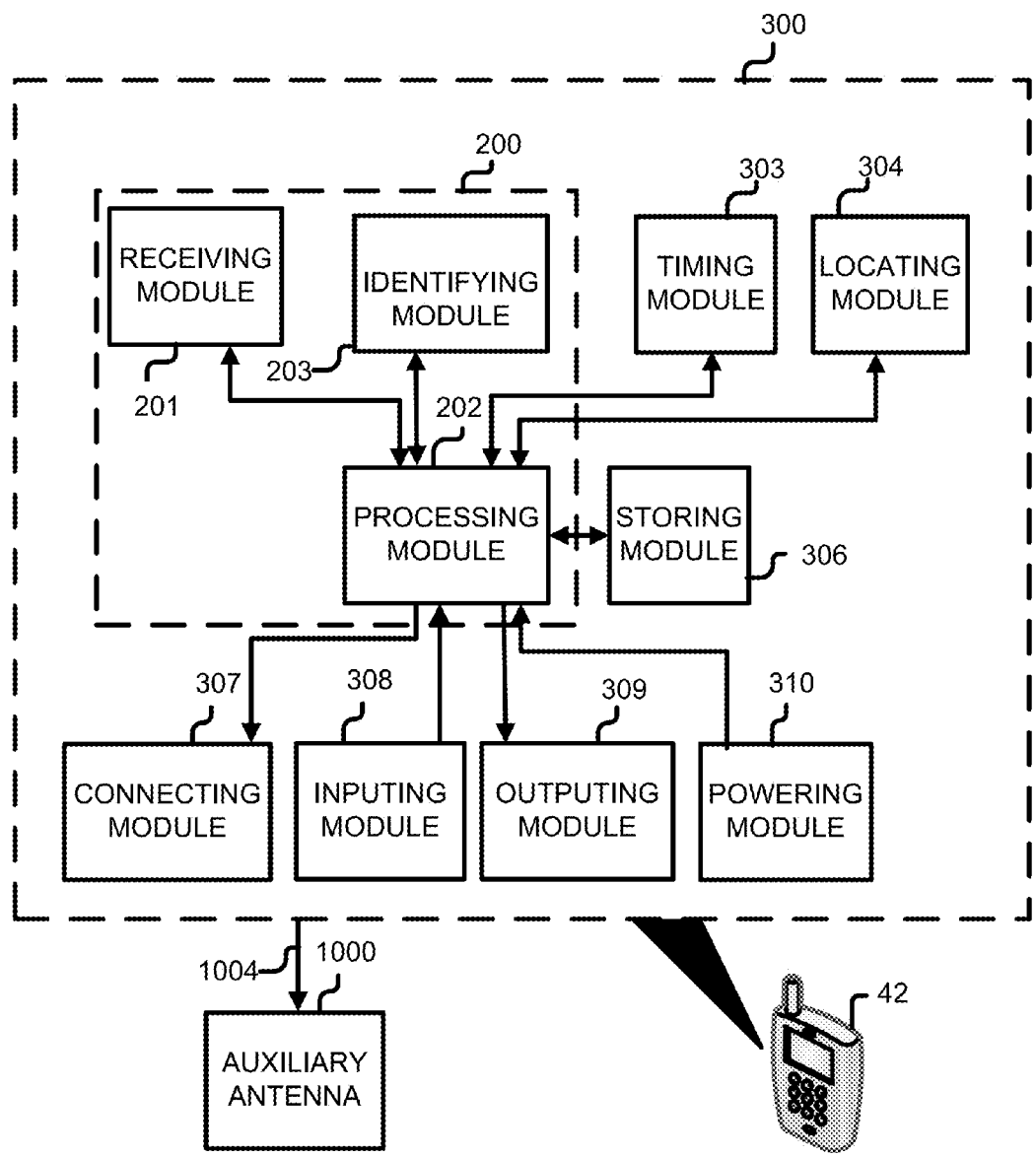
FIG. 6 is an exemplary schematic block diagram of the EMFDD embedded in a mobile phone according to one possible embodiment of the invention.

FIG. 6 illustrates an exemplary embodiment the EMFDA 211 in a mobile phone 42. A plurality of modules 300 are embedded inside a mobile phone 42. The modules for the EMFDD 200 are shown within a dotted line for clarity.

The receiving module 201 includes therein the antenna of the mobile phone 42 of the present embodiment and is adapted for sensing EMF radiation. The receiving module 201 is responsible for sensing the EMF radiation in order to provide an EMF input signal to the processing module 202. The processing module 202 includes the processor of the mobile phone 42. Alternatively, or additionally, the processing module 202 may include a distinct digital signal processor (DSP) inside the mobile phone 42. The processing module 202 may include decoding components to decode encoded EMF input signals with several types of decoding methods. The processing module 202 is responsible for separating the EMF input signal into a plurality of EMF sub-signals and for determining the energy level of each sub-signal.

The identifying module 203 illustrated on FIG. 6 includes switching and selecting components adapted to identify an EMFS 905 for each EMF input signal provided by the processing module 202. The identifying module 203 is responsible for providing identification data such as the location of the EMFS 905, the type of EMFS 905 or the signal signature of the EMFS 905 of each of the EMF input signal, whenever such identification is possible. Otherwise, the EMF input signal is identified as an unknown EMFS 905.

Additionally, the mobile phone 42 can illustratively provide a memory (or any kind of suitable memory means) for implementing the storing module 306, a keyboard for implementing the inputting module 308, a LCD display for implementing the outputting module 309, and a lithium rechargeable battery for implementing the powering module 310. Furthermore, in the exemplary embodiment, the mobile phone 42 is provided with a GPS receiver for implementing the locating module 304 and a calendar-clock component for implementing the timing module 303. Each of these modules can include additional component(s), which might already be present in the exemplary mobile phone 42, or are embedded into the mobile phone 42 by specific customization thereto. For example, the powering module 310 may include a power transformer that converts the voltage of the power grid to an appropriate voltage for each module that requires power. Or, the GPS could be an add-on module to the mobile phone 42.

The GPS receiver implementing the locating module 304 of the present embodiment is responsible for providing the longitude, the latitude, the pointing direction of the locating module 304 and altitude of the EMFDD 200 when a detection event occurs. Alternatively, or additionally, the location of the EMFDD 200 can be defined by a predetermined location stored into the storage module 306. The bearing of the EMFDD 200 can also be material in the determination in advance of EMFs to be encountered along a specific travel direction.

Finally, the illustrative mobile phone 42 provides a serial port, a USB port or a wireless expansion port such as an infrared communication port, or a Bluethooth™ communication port for implementing the connecting module 307. The connecting module 307 is adapted to receive optional auxiliary antenna(s) 1000 connected to the mobile phone with the auxiliary antenna connecting module 1004. The purpose of those auxiliary antenna(s) 1000 is, inter alia, to expand the bandwidth of detectable EMF frequencies.

In operation, modules of the mobile phone 42 illustrated in FIG. 6 sends and receive data via a system bus 123 such as the one illustrated in FIG. 3. The processing module 202 reads a set of predefined instructions stored in the storing module 306 and performs predefined actions in a predetermined sequence.

Figure 7:
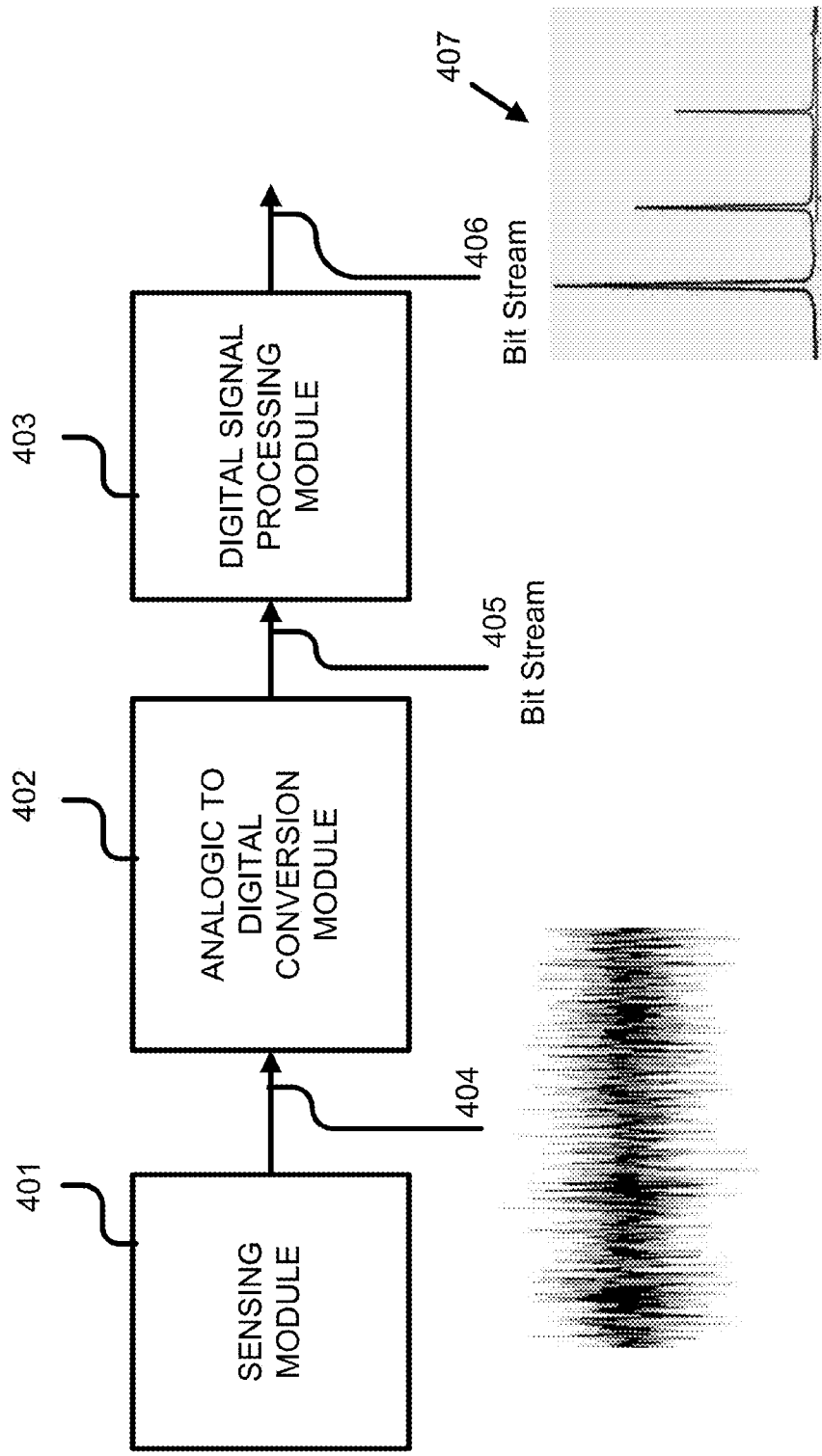
FIG. 7 is an exemplary block diagram illustrating a number of modules for receiving and processing the EMF input signal in accordance with one possible embodiment of the invention.

We turn now to FIG. 7 that illustrates in more details the receiving module 201 in accordance with the present illustrative embodiment. The sensing module 401 senses the EMF radiation using, for instance, the antenna of the mobile phone 42. The sensing module 401 is responsible for providing an analogical signal representing the EMF input signal 404. The EMF input signal is then sampled using a converting module 402. The converting module 402 samples and quantisizes the EMF input signal 404 to convert the EMF input signal 404 into a bit stream signal 405 representing the EMF input signal 404. Next, the digital signal-processing module 403 applies a digital algorithm such as a Discrete-Time Fourier Transform (DTFT), preferably a Fast Fourier Transform (FFT) algorithm, to the sampled and quantizes EMF input signal 405. The digital signal-processing module 403 separates the sampled and quantizized EMF input signal 405 into a plurality of sub-signal(s) in the frequency domain. Each EMF sub-signal is associated with a corresponding frequency, or frequency band. In other words, the digital signal-processing module 403 provides a power spectrum of the sampled and quantizized EMF input signal 405. Furthermore, the digital signal-processing module 403 determines the energy level of each frequency, or frequency band, according to the equation (1) above. The power spectrum follows the equation of the Fourier Transform given in equation (2) below:

$$PowerSpectrum(jw) = \int_{-\infty}^{\infty} S(t)e^{-jw}dt \qquad \text{Equation 2}$$

Wherein the Power Spectrum in the frequency domain corresponds to a series of bins at the frequency of each sub-signal. Although equation (2) is given in the analogical form of the Fourier transform, people skilled in the art will understand that the exemplary embodiment uses the discrete Fourier transform.

When the EMF input signal is not encoded, such as the EMF of a common appliance, the EMF input signal is divided into a plurality of sub-signals using various frequencies. For instance, after the FFT algorithm is applied to the digitized EMF input signal 405, sub-signals are represented by bins in the frequency domain 407. Those bins represent a range of frequencies depending on the frequency resolution of the FFT algorithm. Only the bins having an energy level greater than a predetermined level will be considered active. A band-pass filter may be used to divide the EMF input signal into a plurality of sub-signal.

On the other hand, people skilled in the art will appreciate that the processing module 202 may comprises a decoder that will separate the EMF input signal into a plurality of EMF sub-signal corresponding with their respective EMFS 905 by decoding each EMF sub-signal. The digital signal-processing module 403 may therefore decode the EMF input signal according to the encoding and encryption of the EMF sub-signal(s). Many encoding standards are designed to use the bandwidth effectively and therefore each EMF sub-signal may be sharing a frequency or may be spreaded over a frequency band. These standards of coding for multiple accesses include, but are not limited to, frequency division multiple access (FDMA), time division multiple access (TDMA), code division multiple access (CDMA).

Figure 8:
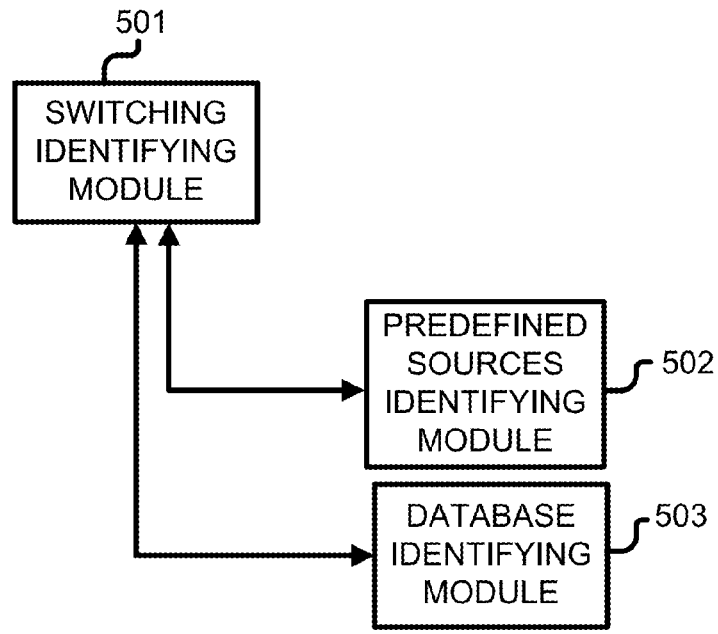
FIG. 8 is an exemplary block diagram illustrating a number of modules for identifying the EMF sub-signal(s) in accordance with one possible embodiment of the invention.

FIG. 8 further illustrates the identifying module 203 which matches each EMF sub-signal data with predefined EMFS 905, 502 data for providing an identification of the EMFS 905. Alternatively the switching identifying module 501 may uses EMFS 905 data in a reference database 503, in view of identifying the respective EMFS 905 of each sub-signal. The identifying module 203 may also use other EMF data such as the date and time at a detection event provided by the timing module 303. The identifying module 203 may also use the geographical location (position) of the detection event provided by the locating module 304. The switching identifying module 501 is illustratively a switching component that is responsible for choosing a component suitable for identification of the EMFS 905.

Figure 9:
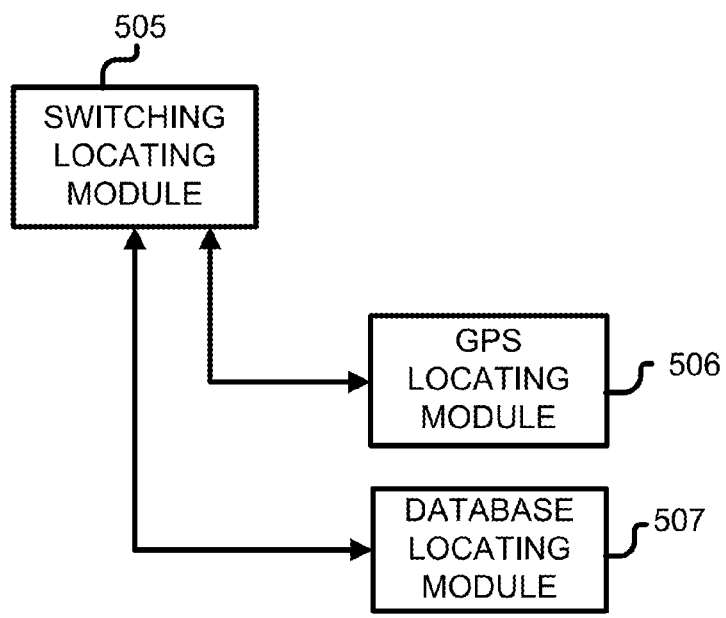
FIG. 9 is an exemplary block diagram illustrating a number of modules for the locating module of the EMFDD in accordance with one possible embodiment of the invention.

FIG. 9 is directed to the locating module 304, which matches each EMF sub-signal data with predefined GPS data 506 for providing a location of the EMFS 905. Alternatively the switching locating module 304 may uses EMFS 905 data in a reference locating database 507, in view of identifying the respective location of each sub-signal. The locating module 304 may also use other EMF data such as the date and time at a detection event provided by the timing module 303. The identifying module 203 may also use the geographical location (position) of the detection event provided by the locating module 304. The switching identifying module 501 is illustratively a switching component that is responsible for choosing a component suitable for identification of the EMFS 905.

The EMFDD Separated from EMFDA

Analogical Receiving and Triangulation Location

Figure 10:
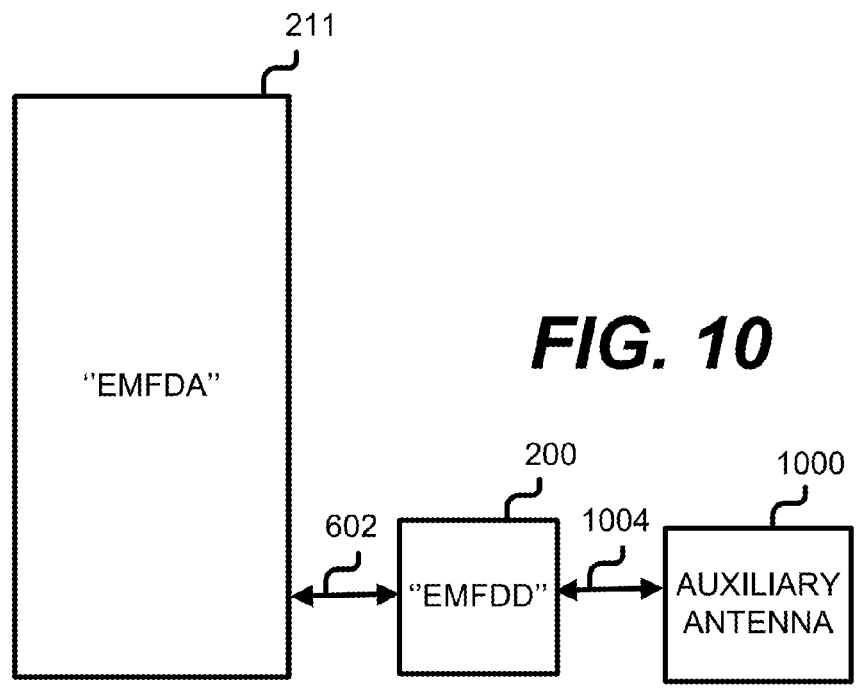
FIG. 10 illustrates an exemplary block diagram illustrating a number of modules of the EMFDD separated from the EMFDA of one alternate embodiment in accordance with one possible embodiment of the invention.

FIG. 10 illustrates an alternative embodiment of EMFDD 200, where the EMFDD 200 is separated from the EMFDA 905. In the present illustrative embodiment, the EMFDA 211 is a desktop computer 48. The EMFDD 200 is connected to the EMFDA 211 through a connecting module 602. The EMFDD 200 is adapted to communicate with the desktop computer 48 via a link 602 such as a wireless Bluethooth™ or a serial cable 602. An auxiliary antenna 1000 may be provided to expand the readable frequency range of the embodiment of the EMFDD 200. They are connected with their own connecting module 1004 (e.g. cable, socket, other).

Figure 11:
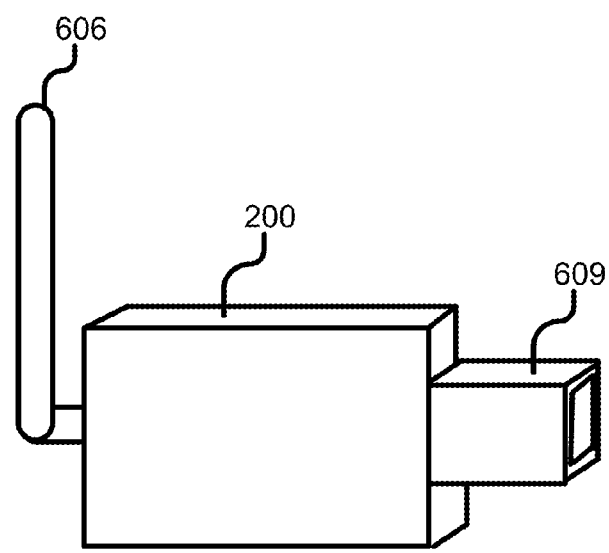
FIG. 11 is a perspective view of the EMFDD of one alternate embodiment in accordance with one possible embodiment of the invention.

FIG. 11 illustrates the external EMFDD 200 implemented in a housing shaped as a USB key-like format. This alternate embodiment of the EMFDD 200 includes an external antenna 606 connected to the EMFDD 200, and connects to the USB port of the desktop computer 48 via a USB connection adaptor 609. The antenna 606 could be internal without departing from the scope of the invention. Communication via other connector types and other protocols are considered to be within the scope of the present application despite they are not furthermore discussed herein.

Figure 12:
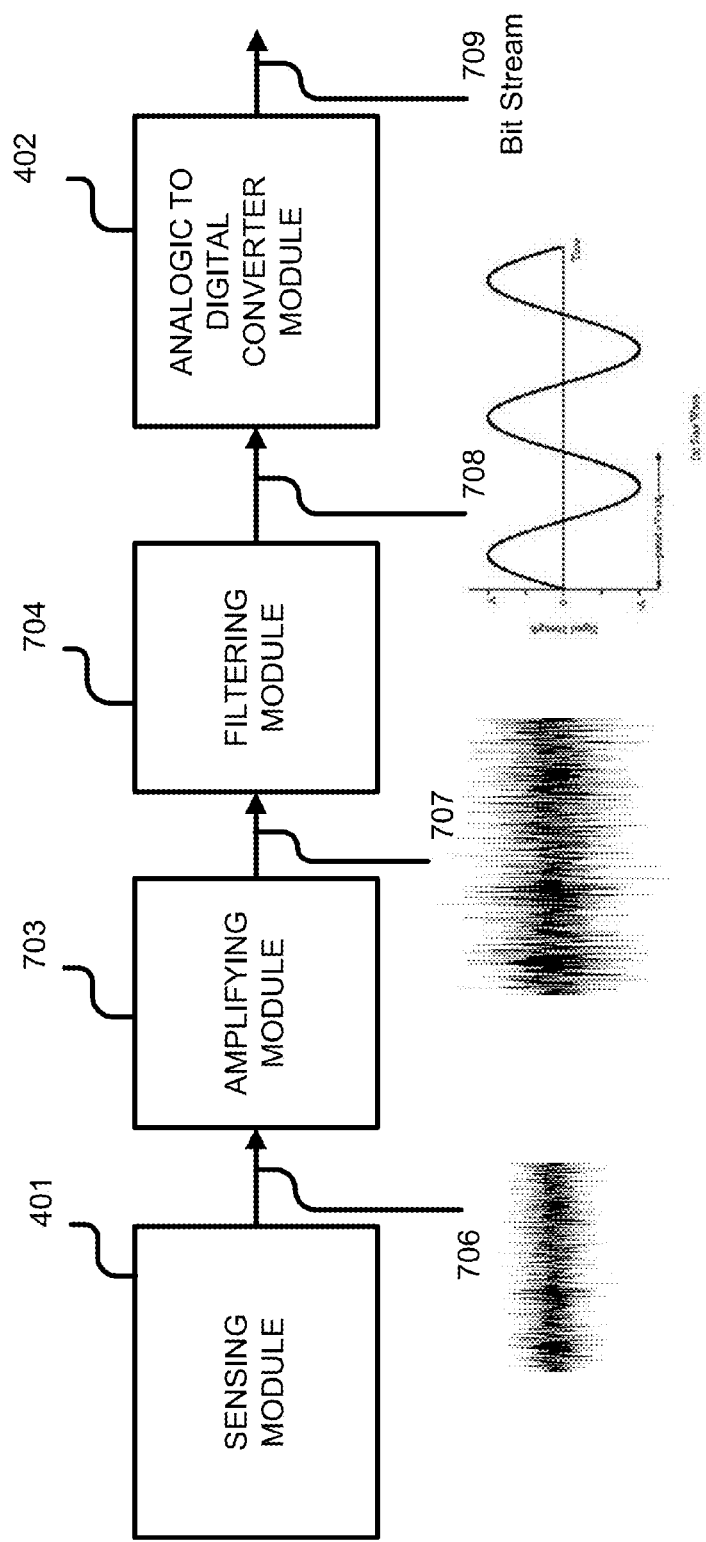
FIG. 12 is an exemplary block diagram illustrating a number of modules of the receiving module and processing module in accordance with one possible embodiment of the invention.

FIG. 12 illustrates an alternate implementation of the receiving module 201 illustrated on FIG. 4. The modules of FIG. 12 use analogical technology for receiving and processing the EMF input signal(s). The EMF radiation induces a voltage, or a current, in a sensing module 401 that is responsible for providing the EMF input signal 706. An analogical amplifying module 703 then amplifies the EMF input signal 404 to provide the EMF amplified input signal 707. The amplified EMF input signal 707 is then passed through a filtering module 704 that includes a band-pass filter that is tuned to a predetermined central frequency. The filtered analogical signal 708 is then passed to the converting module 402 that converts the filtered analogical signal 708 into a bit stream 709 representing the EMF sub-signal of the tuned pass-band filter central frequency.

The process will be repeated at different frequencies until each EMF sub-signal has been scanned. In other words, each EMF sub-signal will be separated from the combined EMF input signal by tuning and filtering at the frequency corresponding to each EMF sub-signal. The processing module 202 implemented inside the EMFDD 200 scans a predetermined band of the EMF frequency spectrum, by tuning a central frequency of a band-pass filter, in a predetermined sequence in order to read each of the EMF sub-signal separately. The processing module will also include component to determine the energy level of each EMF sub-signal. Only the EMF sub-signals with sensed activities would be further processed. In other words, the energy level of the EMF sub-signal would have to be greater than a predetermined and tunable energy level to be considered active.

Figure 13:
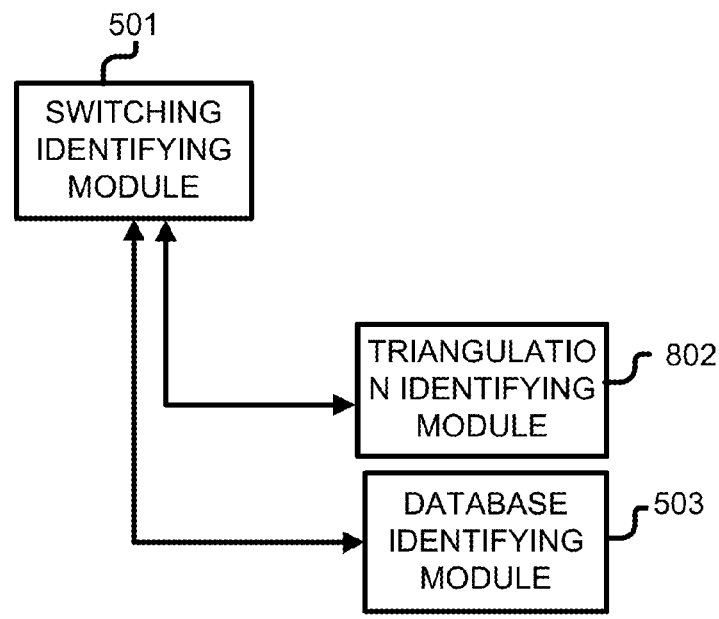
FIG. 13 is an exemplary block diagram of the identifying module in accordance with one possible embodiment of the invention.

FIG. 13 illustrates different components of the identifying module 203. The switching identifying module 501 is responsible for selecting a component adapted to identify the EMFS 905. The identification of the EMFS 905 corresponding to each EMF sub-signals. In this alternate exemplary embodiment the identifying module uses a triangulation identifying module 802 which is adapted to locate the EMFS 905. Alternatively the identification of the EMFS 905 can be provided by a reference database 503 of EMFS 905.

The identifying module 501 comprises a triangulation identification module 802 for determining the position of the EMFDD 200 by reading the electronic signature of various known EMF emitters for instance. The identifying module 501 may also include a database 503 of the known sources classified by the data of each EMFS 905. The identifying module 501 may then use this EMFS 905 reference database to associate an EMFS 905 for each of the EMF sub-signal received from the processing module 202. Alternatively, or additionally, the identifying module 501 may use a Cell Tower triangulation technique embodied in the triangulation identifying module 802 to identify the EMFS 905 location. The identifying module 801 may use a number of previously received EMF sub-signal. By using the determined energy level of this EMF sub-signal and the localization of the EMFDD 200 when these sub-signals were received to find the location of the EMFS 905.

This EMFS 905 reference database is adapted to be installed on a server in a networked configuration. The EMFS 905 reference database includes information about known EMFS 905, wherein those EMFS 905 data can be gathered and put in common by many other users or, also, put in place by a service provider.

Figure 14:
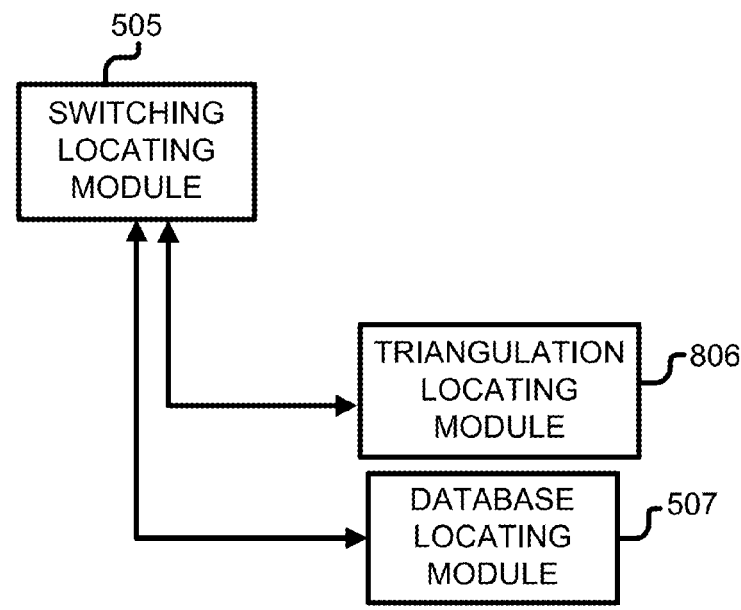
FIG. 14 is an exemplary block diagram of the locating module in accordance with one possible embodiment of the invention.

FIG. 14 illustrates different components of the locating module 304. The switching locating module 505 in the alternate embodiment may select a triangulation locating module 806 adapted to perform a triangulation method for providing the longitude, latitude and altitude of the EMFDD 200 at a detection event. In other words, the triangulation locating module 806 includes component adapted to locate the EMFDD 200 by mobile phone 42 cell tower triangulation method or equivalent processes. Alternatively, or additionally, the location of the EMFDD 200 can be defined by a predetermined location, which is stored into a database 507.

The EMFDA and EMFS

FIG. 15 illustrates a number of potential possible illustrative EMFDA 900 such as: a watch 901, a pair of earring 902, a ring 903, a necklace 904, a desktop computer 48, a laptop computer 40, and a mobile phone 42, a personal digital assistant (PDA) 36. The module of the EMFDD 200 may be implemented into these EMFDA 800 as explained above for the first illustrative embodiment. Or, the modules of the EMFDD 200 are implemented separately from the EMFDA 211.

The EMFDA 905 of the first illustrative embodiment is adapted to communicate with the communication network using a cell tower 912 for a wireless access to a server. Alternatively, like in the second illustrative embodiment where the EMFDD 200 is built separately from the EMFDA 211, the EMFDA 211 can be connected via Ethernet 913 to a router that will connect the EMFDA 211 with the communication network 30. Either embodiments may use a networked system 910 that includes a network server 14 adapted to host a database 32. Alternatively, a direct link 911 for testing purposes may be provided to connect the EMFDA 211 with the network server 14.

FIG. 15 also illustrates a number of exemplary EMFS 905 such as a computer screen 34, a wi-fi device 906, a microwave oven 907, a cell tower 908, and an electrical power line 909.

Auxiliary Antenna

The EMFDD 200 receiving module 201 comprises at least one antenna. In the case where the EMFDD 200 is embedded into an EMFDA 211 the EMFDD 200 can optionally use the antenna of the EMFDA 211. On the other hand, in an alternate embodiment, where the EMFDD 200 is outside the EMFDA 211, the EMFDD 200 is provided with its own antenna 606. However, auxiliary antennas 1000 are optionally provided and are adapted to properly cooperate with each embodiment. These auxiliary antennas 1000 will extend the range of frequency and type of fields that can be detected with the EMFDD 200.

Figure 16:
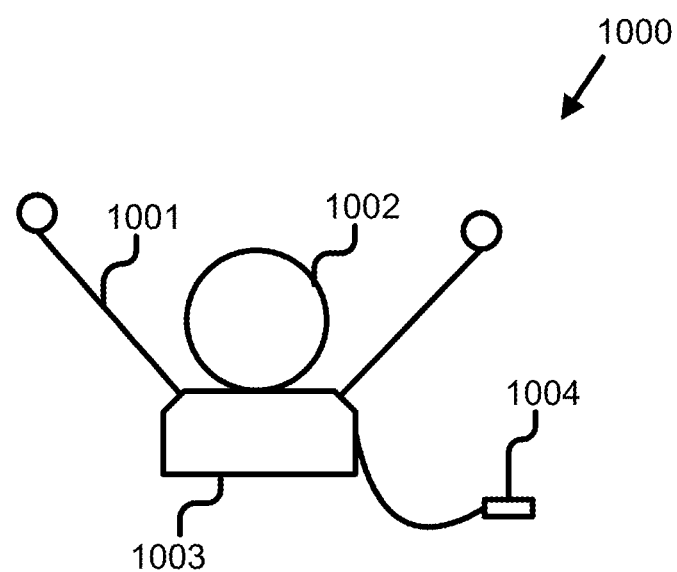
FIG. 16 is an exemplary auxiliary antenna in accordance with in accordance with one possible embodiment of the invention.

FIG. 16 illustrates an exemplary embodiment of an auxiliary antenna 1000. The example illustrates a dipole antenna 1001 depicted by a pair of extending element in V-shape configuration for sensing the EMF. The exemplary embodiment of the auxiliary antenna 1000 also illustrates a loop antenna 1002 for sensing the EMF. The connection component 1004 of the illustrative auxiliary antenna 1000 may be used to connect to the EMFDA 211 external port-connecting module 307 or directly to the EMFDD 200. Each antenna is connected to the auxiliary antenna housing 1003 in the present embodiment. Typically, the kind of auxiliary antenna 1000 depicted in FIG. 16 is referred to as rabbit ears antenna and it is known for receiving television frequencies. Several other types of auxiliary antennas are contemplated herein such as satellite dish antenna, yagi harmonic antenna, roof top antenna etc.

Figure 17:
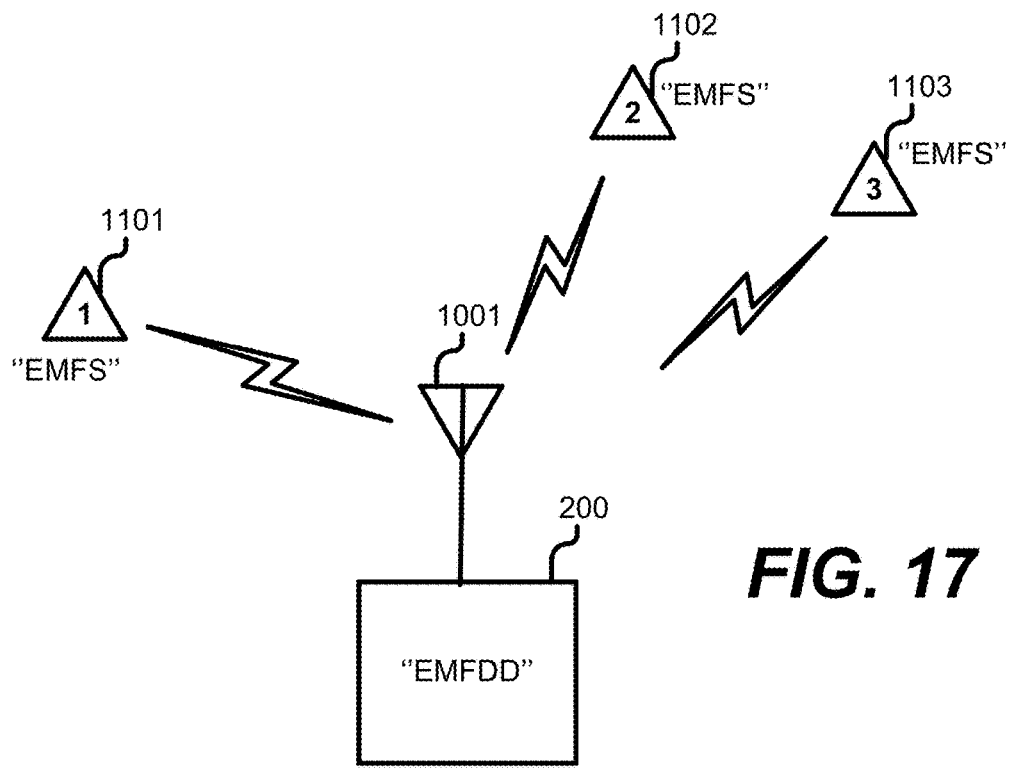
FIG. 17 is an exemplary dipole antenna of the EMFDD and EMFSs in accordance with one possible embodiment of the invention.

FIG. 17 illustrates an EMFDD 200 receiving an EMF input signal that is made of a plurality of EMF sub-signal(s) emitted from three different EMFS 905 in this case represented by numbers 1101,1102 and 1103. FIG. 17 depicts a dipole antenna 1001. The dipole antenna 1001 is adapted to be induced by electric fields portions of the EMF waves. Typically, the dipole antenna 1001 length is a fraction of the wave length of the EMF input signal.

Figure 18:
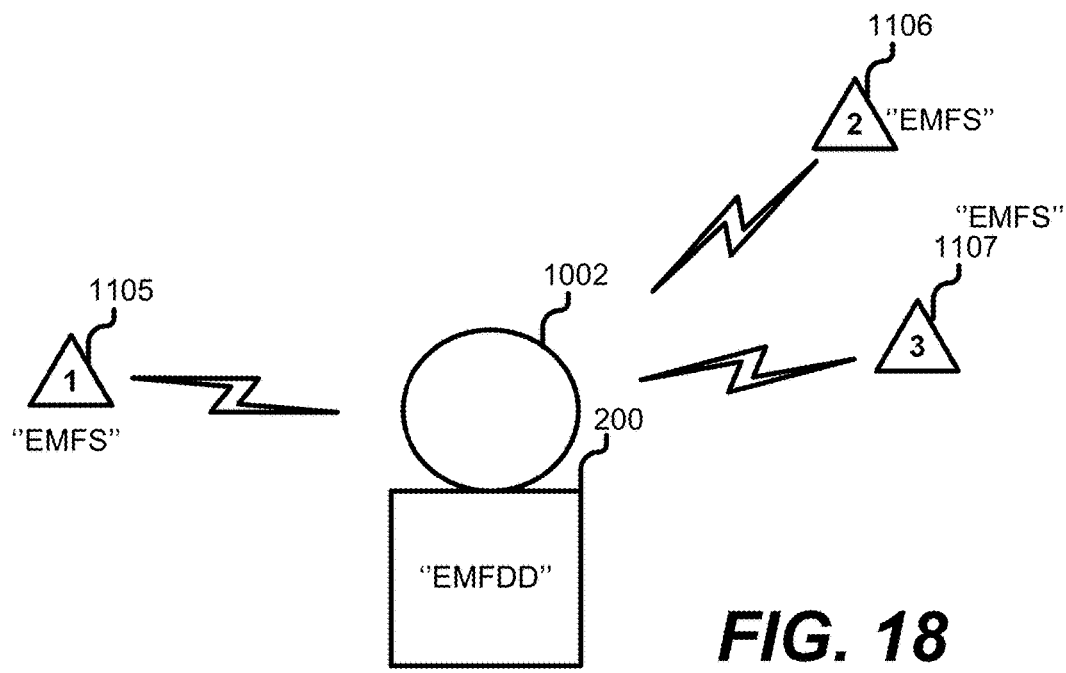
FIG. 18 is an exemplary loop antenna of the EMFDD and EMFSs in accordance with one possible embodiment of the invention.

FIG. 18 illustrates an EMFDD 200 using a loop antenna 1002 for detecting EMF input signal from several EMFS 905 in this case represented by the numbers 1105, 1106 and 1107. The loop antenna 1002 is typically used for extremely low frequency (ELF) signals such as the one found in the power distribution grid or for ultra high frequency signal such as UHF television station. Whenever the use of a dipole antenna would not be practical because of the size of the necessary dipole antenna to detect such frequency.

The use of other type of auxiliary antenna 1000 are also contemplated, such as satellite dish for detecting the satellite frequencies, Geiger meter for radioactivity, yagi harmonic antenna, roof top antennas adapted for receiving and transmitting with more power than permitted by a mobile handset etc.

Network Configuration

A plurality of EMFDDs 200 may be arranged in a network configuration. The plurality of devices may then cover a wide region such as a building, a neighborhood, a city, a state or a county, among other places. Each of the EMFDDs 200 may be configured to gather EMF data and be adapted to associate to those EMF data a date-time measure and a geographical coordinate. The plurality of devices may be configured to gather data automatically or on demand. The received EMF data may then be transmitted to a server 14 adapted to host a database 30 adapted to store the EMF data. Such a server 14 and database 30 are adapted to store EMF data for an extended period of time such as a day, a month or even many years. Each EMFDD 200 that gathers EMF data provides its unique identification code and its location data in absolute coordinates in addition to the date-time stamp therewith. As previously mentioned, one possible manner for locating an EMFDD 200 is to use a global positioning system (GPS) therein or therewith. The GPS component receives a location data from relevant satellites providing the longitude, the latitude and the altitude of the EMFDD 200. Another example of locator module would be the location components of a mobile phone 42 using, for example, cell towers triangulation. By using absolute coordinates for location, the server 14 can be moved and doesn't have to be in proximity of any of the EMFDDs 200 connected therewith and arranged in a network thereof since the location does not depend on the distance from the server 14. In operation, the EMFDA 211 shown in FIG. 15 communicates data via a wired or a wireless communication network 30. In the event no GPS is available or triangulation is not possible, or if the EMFDA 211 is stationary, the geographical location can be manually entered.

The detected EMF sub-signals and their respective EMF data, such as frequency, energy level, date-time of detection event, location of the EMFDD 200 for each detection event and identification of the EMFS 905, etc. are stored in a format adapted to be shared through a network comprising many EMFDDs 200. In particular, a unique identification number for each EMFDD 200 will be associated and stored with the EMF's recorded data, for each detected event.

Detected EMF data will be compared and, when possible, correspond to the known EMFS 905 data in a reference database for identifying each sub-signal associated with the EMFS 905. The identification of the EMFS 905 may be based on a limited amount of positively corresponding data. For that reason, a percentage of probability will be assigned to the identification of each EMFS 905. A percentage of probability can be assigned to each EMFS 905 identification with a mechanism similar to the percentage of relevance used by some web search engines. For instance, when the EMFDD 200 identifying module 203 determines that an EMFS 905 might be a microwave oven based only on the frequency of the received EMF input signal, the EMFDD 200 will indicate a percentage of probability that the identification is accurate. This probability will be low if only some EMF data successfully correspond with relevant microwave oven typical EMFS 905 data on record. On the other hand, if the EMF input signal contains a signed signal, the probability of a good identification would be close to 100%. For instance, a high voltage transmission line will have a specific EMF signature and, when associated with a GPS location, the probability that a sensed EMFS 905 having this precise signature at this precise location will be rather high if not reaching 100% accuracy.

The EMFDD in Use

The EMFDD 200 may be secured on a belt or carried around the wrist of a user. In case where the EMFDD 200 in embedded in jewelry, the person wears the EMFDD 200 like a normal jewelry such as a pair of earrings 180, a necklace 182 or a watch 179 among other possible objects.

When a plurality of EMFDD 200 is arranged in a wide area network (WAN), the server 14 may be configured to poll each EMFDD 200 one by one or in simultaneously real time. In other circumstances, the EMFDD 200 would be on stand-by mode and wait to receive an activating signal from the network-based server 14 to gather the EMF data and to transmit results to the network-based server 14. The EMFDD 200 can also be programmed to work periodically, at particular time periods, in specific geographical locations or only when a predetermined EMF level threshold is reached. In other cases, the antenna or the EMFDD 200 will be provided with a locally accessible memory that will allow them to gather EMF data even when the network-based server 14 is down or simply out of reach. Alternatively, each EMFDD 200 can download the collected data automatically when they can efficiently do it via any kind of network to periodically send the data to the server and thus clear their respective memory.

In operation, three or more EMFDDs 200 can act as base points for triangulation calculation for assessing the EMF energy level between the EMFDDs 200. For example, when the location of three EMFDD 200 are associated with EMF data and are not on the same line, the EMF energy level can be calculated at a point somewhere in the imaginary plan created by lines connecting the (three) locations of the EMFDDs 200. A graphical representation, like a map, can be drawn with contour lines representing the EMF energy level at that location, like contour lines representing heights on topographical maps. The map thus created can also include, or be superposed to, mapping of other data, like, for instance, and not limited to, the location of mobile phone base-stations, the location of the EMFS 905, and the location of the EMFDDs 200 in a city or any other places. Streets, houses, and other suitable information can be added to the map to ensure proper appreciation of the EMF in respect to known locations. Satellite images and road view pictures/clips can also optionally be added as layers.

In network-based embodiment(s), the network-based server 14 may be accessible with a WEB interface and may illustratively, but not necessarily limited to, use a TCP/IP protocol to transfer the EMF data. The server may control the predetermined maximum threshold of EMF energy level and the maximum EMF exposition time. A WEB based application will allow the user to enter EMF data related to the EMFDD 200 and related to the EMFS 905. The data related to the EMFS 905 will facilitate the identification of the EMFS 905 and facilitate the assessment of each EMFS 905 contribution to the overall EMF exposition. The EMF data would then be analyzed and compared to EMF data stored in databases 30 of network-based server 14. The identification of the EMFS 905 may be made by comparing the result with EMF data or EMFS 905 data provided by a paid service or entered by users in an electronic database 30 indexed with time, the EMF frequency, the EMF recordation location and the strength of the detected EMF data. Different algorithms may then identify the EMFS 905 associated with each EMF sub-signal. Alternatively, or additionally, a signal signature such as the name of a television channel or radio station may be detected in the EMF input signal.

The EMF data received would preferably be secured on the paid provider side in order to prevent tampering with the received EMF data. Users will be able to log into the WEB application and be allowed to see the EMF exposition between different EMF data on record. The EMF data will be analyzed using methods such as interpolation in function of the location or in function of the date and time of detection. In other words, the user will be capable to see the energy level variation on a map and over time (a bit like weather forecasts satellite images). Therefore, the user can known in advance how much EMF exposure can be expected at a certain location on the map even if detected events were recorded around the precise desired location and not exactly at the specific location. Similarly, the user will be allowed to know the exposure at a specific moment in time by interpolation of detection events that happened about the specific time, even if no EMF detection event occurred at that time.

Database for Identifying the EMFS

The EMFDD 200 may use a database of references containing data about the EMFS 905. Such databases can be filled using information directly provided by manufacturers of appliances such as manufacturers of microwave ovens or manufacturers of mobile phone, or information provided by electricity companies using a grid to distribute power. In the later case, the information may include EMF data relating to the location of the power lines, the location of relay stations, etc. The EMF data relating to the EMFS 905 can also come from the mobile phone company that would provide data about the localization of the cellular phone base-station. Another possible source of EMFS 905 information can be the web site of the federal communication commission ("FCC") which provide the location of cell tower depending on the area the user selects. Many countries have such organization that regulates the use of the frequency spectrum. It is realistic that governments might oblige companies to put EMF related data in such a database based on the rapidly growing concerns about EMF exposition.

EMF Data Threshold

EMF threshold data may be established according to studies that give maximum EMF radiation exposure acceptable in a type of work, industry or by international and national health care organizations. An exemplary measure is the Specific Absorption Rate, commonly refer to as SAR that is a standardized measure of EMF exposition. Manufacturer of mobile phone and personal digital assistant (PDA) must comply with a certain level of SAR exposure and will perform the required tests according to standardized procedure. This allows the public to compare apparatuses that radiate EMF. SAR is a measure that is in function of the weight of a person and a measure in Watt/kg. A standard measure for the electrical field is given in Volt/meters (V/m) while a standard measure for exposure to EMF is given in Watt/square meters (W/m.sup.2). Examples of such threshold EMF data, provided by ICNIRP studies, are given in the following Table 2, Table 3 and Table 4:

TABLE 2

Basic restrictions for time varying electric and magnetic fields for frequencies up to 10 GHz.

| Exposure characteristics | Frequency range | Current density for head and trunk (mA m$^{-2}$) (rms) | Whole-body average SAR (W kg$^{-1}$) | Localized SAR (head and trunk) (W kg$^{-1}$) | Localized SAR (limbs) (W kg$^{-1}$) |
|---|---|---|---|---|---|
| Occupational exposure | up to 1 Hz | 40 | — | — | — |
| | 1-4 Hz | 40/f | — | — | — |
| | 4 Hz-1 kHz | 10 | — | — | — |
| | 1-100 kHz | f/100 | — | — | — |
| | 100 kHz-10 MHz | f/100 | 0.4 | 10 | 20 |
| | 10 MHz-10 GHz | — | 0.4 | 10 | 20 |
| General public exposure | up to 1 Hz | 8 | — | — | — |
| | 1-4 Hz | 8/f | — | — | — |
| | 4 Hz-1 kHz | 2 | — | — | — |
| | 1-100 kHz | f/500 | — | — | — |
| | 100 kHz-10 MHz | f/500 | 0.08 | 2 | 4 |
| | 10 MHz-10 GHz | — | 0.08 | 2 | 4 |

TABLE 3

Reference levels for occupational exposure to time-varying electric and magnetic fields (unperturbed rms values)

| Frequency range | E-field strength (V m$^{-1}$) | H-field strength (A m$^{-1}$) | B-field (µT) | Equivalent plane wave power density S$_{eq}$ (W m$^{-2}$) |
|---|---|---|---|---|
| up to 1 Hz | — | 1.63 × 10$^5$ | 2 × 10$^2$ | — |
| 1-8 Hz | 20,000 | 1.63 × 10$^6$/f$^2$ | 2 × 10$^5$/f$^2$ | — |
| 8-25 Hz | 20,000 | 2 × 10$^4$/f | 2.5 × 10$^2$/f | — |
| 0.025-0.82 kHz | 500/f | 20/f | 25/f | — |
| 0.82-65 kHz | 610 | 24.4 | 30.7 | — |
| 0.065-1 MHz | 610 | 1.6/f | 2.0/f | — |
| 1-10 MHz | 610/f | 1.6/f | 2.0/f | — |
| 10-400 MHz | 61 | 0.16 | 0.2 | 10 |
| 400-2,000 MHz | 3f$^{1/2}$ | 0.008f$^{1/2}$ | 0.01f$^{1/2}$ | f/40 |
| 2-300 GHz | 137 | 0.36 | 0.45 | 50 |

TABLE 4

Reference levels for general public exposure to time-varying electric and magnetic fields (unperturbed rms values)

| Frequency range | E-field strength (V m$^{-1}$) | H-field strength (A m$^{-1}$) | B-field (µT) | Equivalent plane wave power density S$_{eq}$ (W m$^{-2}$) |
|---|---|---|---|---|
| up to 1 Hz | — | 3.2 × 10$^2$ | 4 × 10$^4$ | — |
| 1-8 Hz | 10,000 | 3.2 × 10$^2$/f$^2$ | 4 × 10$^4$/f$^2$ | — |
| 8-25 Hz | 10,000 | 4,000/f | 5,000/f | — |
| 0.025-0.8 kHz | 250/f | 4/f | 5/f | — |
| 0.8-3 kHz | 250/f | 5 | 6.25 | — |
| 3-150 kHz | 87 | 5 | 6.25 | — |
| 0.15-1 MHz | 87 | 0.73/f | 0.92/f | — |
| 1-10 MHz | 87/f$^{1/2}$ | 0.73/f | 0.92/f | — |
| 10-400 MHz | 28 | 0.073 | 0.092 | 2 |
| 400-2,000 MHz | 1.375f$^{1/2}$ | 0.0037f$^{1/2}$ | 0.0046f$^{1/2}$ | f/200 |
| 2-300 GHz | 61 | 0.16 | 0.20 | 10 |

Different scientific bases were used in the development of basic exposure restrictions for various frequency ranges: Between 1 Hz and 10 MHz, basic restrictions are provided on current density to prevent effects on nervous system functions; Between 100 kHz and 10 GHz, basic restrictions on SAR are provided to prevent whole-body heat stress and excessive localized tissue heating; in the 100 kHz-10 MHz range, restrictions are provided on both current density and SAR; and Between 10 and 300 GHz, basic restrictions are provided on power density to prevent excessive heating in tissue at or near the body surface. In view of the safety considerations above, it was decided that, for frequencies in the range 4 Hz to 1 kHz, occupational exposure should be limited to fields that induce current densities less than 10 mA m, i.e., to use a safety factor of 10. For the general public an additional factor of 5 is applied, giving a basic exposure restriction of 2 mA m.

Illustrative Applications and Results

Figure 19:
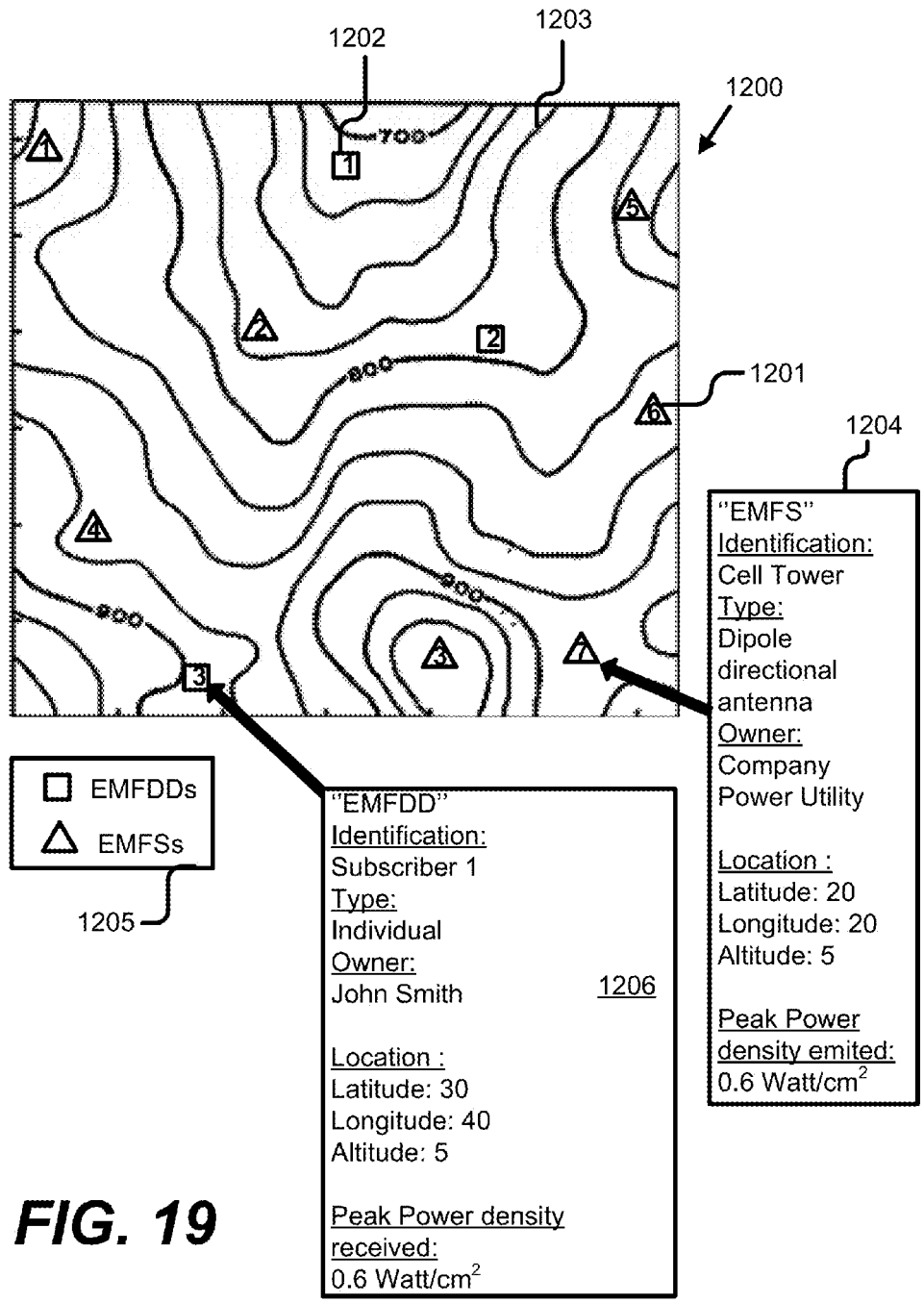
FIG. 19 illustrates an exemplary screen snap-shot of an application for setting the EMFDD and EMFS information in a networked application in accordance with one possible embodiment of the invention.

FIG. 19 illustrates a contour map 1200 showing the location of EMFDDs 200 and EMFSs 905. The legend 1205 indicates that the square-shaped symbols 1202 represent the location of various EMFDDs 200 and the triangular-shaped symbols 1201 represent the EMFS 905. In both embodiments this map could be displayed in a WEB application. The user may login the application and transfer data about the EMFSs 905. The system may be similar to the system currently provided under the brand GOOGLE EARTH, where users can upload information therein about a location on the map by, for instance, selecting symbols on the map. The dialog such as illustrative EMFS 905 dialog 1204 opens to enter information about the EMFS 905 at that specific location. One purpose of this system is to provide information that will be used by the identifying module 203 of the EMFDD 200. Alternatively, the upload could be automatic and information from EMFDDs 200 are automatically uploaded to collect a maximum of information in real time. This process can be invisible to the user of the EMFDD 200. Also, the user can enter its data about location and identity in an EMFDD 200. The user may enter information about a EMFDD 200 by clicking the appropriate EMFDD 200 symbol. A EMFDD 200 dialog 1206 will open accordingly.

Many detected EMF sub-signals and other detected EMF data associated therewith can be put in common among a large number of subscribers therefore creating a more precise image of the EMFS 905 reality in one's environment. A user can then log into the WEB application and see the different contour lines 1203 representing similar EMF energy levels. Those lines will be drawn over a road map of a city for example. Consequently, the user can determined what kind of EMF exposure can be found at different location and at a specific time of the day. In other words, the EMF energy level can be interpolated between the different EMFDD 200 detection events. The server 14 may also determine the EMF energy level contour lines by using algorithms that calculate EMF energy levels using the location, time and type of EMFS 905. For instance, contour lines may depict the EMF radiation pattern next to a mobile phone tower.

Figure 20:
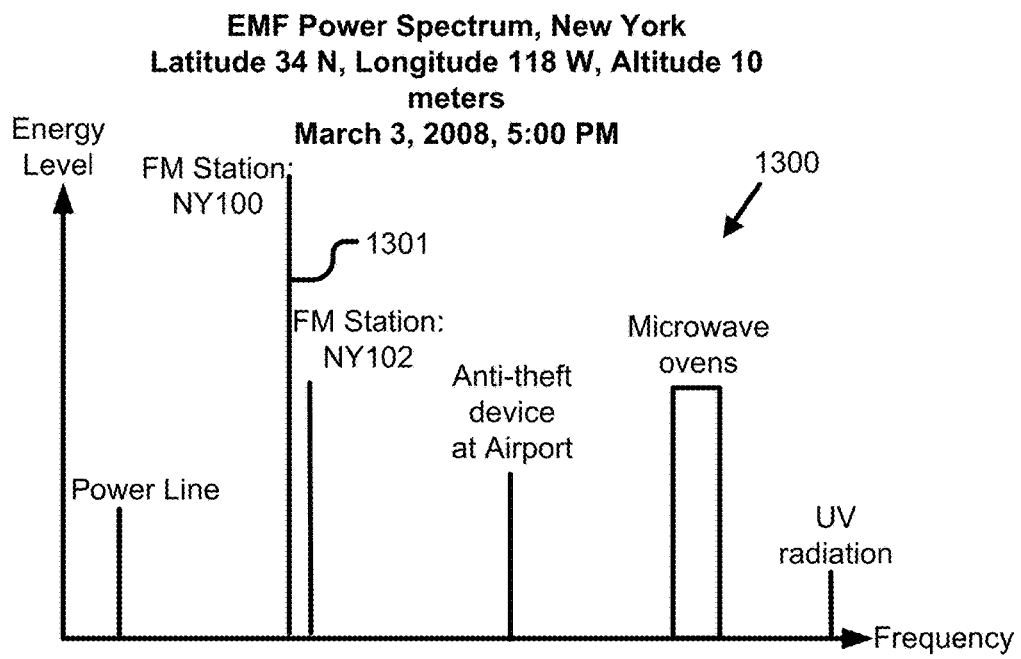
FIG. 20 illustrates an exemplary screen snap-shot of sub-signal spectrum in accordance with one possible embodiment of the invention.

FIG. 20 illustrates the power spectrum 1300 of an EMF input signal separated into a plurality of EMF sub-signals. Each peak 1301 represents the EMF energy level of an EMF sub-signal received at that frequency, or frequencies, range. It is to be noted that a sub-signal detected at a specific frequency can represent, for example, different television broadcasters or radio stations in another city. This is possible because transmitting antennas have limited power of transmission and therefore they cover only a limited area. In United States for instance, the federal communication commission (FCC) is the organization responsible of allocating frequencies telecommunication companies. We can find information about the frequency allocated in an area by logging into the FCC web site, browsing to the antenna information page and typing a location like New York city or Los Angeles into their WEB application. This type of data can be uploaded in the EMF database of the present invention and be used improve the precision of the analysis made and provide more tangible information to users.

Figure 21:
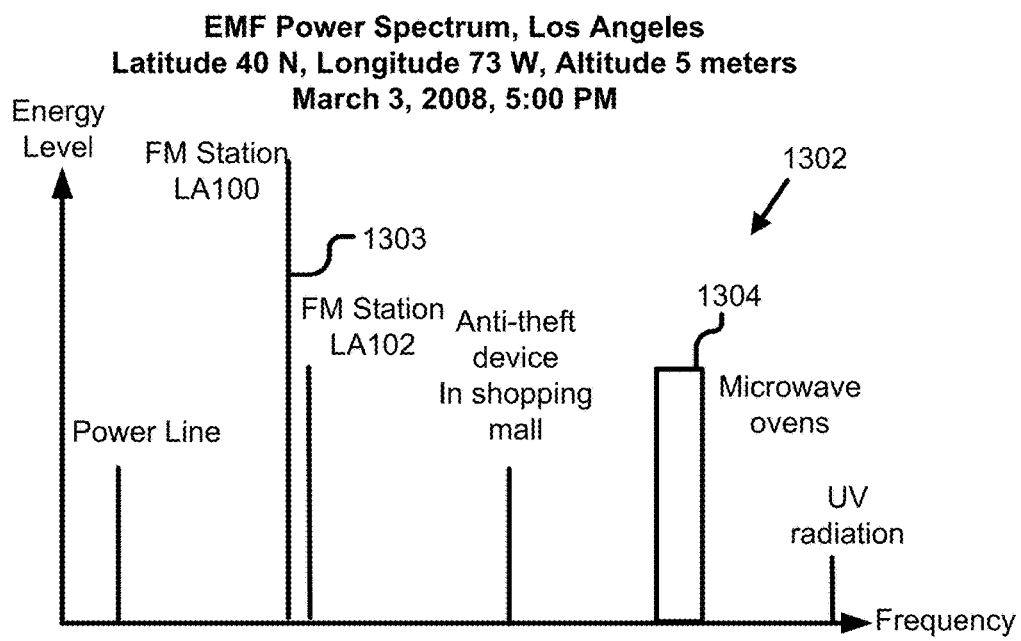
FIG. 21 illustrates another exemplary screen snap-shot of sub-signal spectrum in accordance with one possible embodiment of the invention.

With this in mind, the identifying module 203 must take into account that the EMFS 905 have a limited range. Consequently, EMF sub-signal with the same frequency may come from a different EMFS 905 depending on the area where they were detected. Because EMFS 905 have a limited amount of energy to transmit, the area they cover is limited. Consequently, the same frequencies in Los Angeles can be associated to a different EMFS 905 in New York city. To illustrate that the identification of EMFS 905 depends of the location of the EMFDD 200 when the EMF detection is made. FIG. 21 illustrates the same energy peak 1303 with a different identification (same as peak 1301 in FIG. 20. As can be appreciated, FIG. 20 illustrates a first power spectrum 1300 that is recorded, for example, in New York city, on Mar. 3, 2008, at 5 PM sharp, at location 34 N latitude and 118 W longitude, 10 meters altitude, while FIG. 21 illustrates a very similar power spectrum 1302 but this time taken in Los Angeles.

Figure 22:
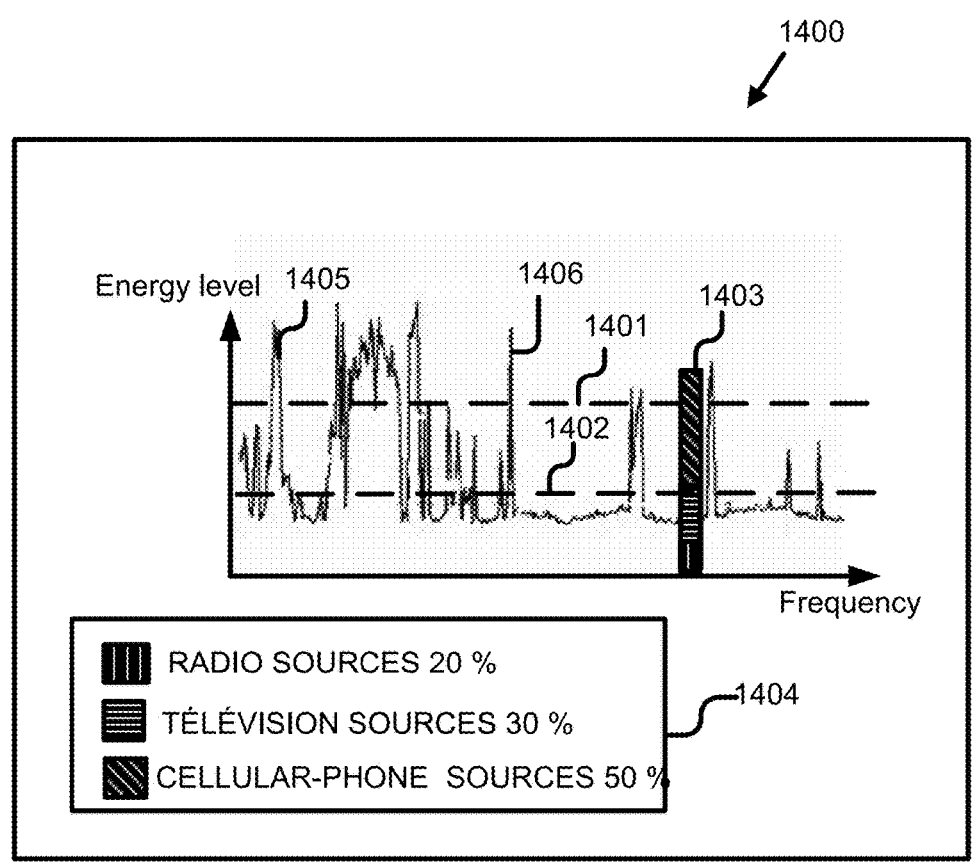
FIG. 22 illustrates an exemplary screen snap-shot of the power spectrum in accordance with one possible embodiment of the invention.

FIG. 22 illustrates an exemplary output screen 1400 showing the power spectrum 1405 of an EMF input signal where peaks 1406 represent active EMF sub-signal(s) at different frequencies. The dotted lines 1401, 1402 represent predetermined threshold values for the maximum energy level received. These limits may trigger an alarm to warn the user of a possible EMF overexposure or begin active recording of EMFS and transmit, in real time or delayed, the recorded data to the network to be shared and analyzed. Threshold limit 1401 is the maximum value where the instantaneous energy level becomes dangerous. The second limit 1402 which is typically lower represents the amount of EMF exposure that could be problematic if the user stays exposed thereof for a predetermined amount of time. Columns of different patterns 1403 represent the quantity of the energy level forming this energy level peak. Since many encoding method will share the same frequency this display allows the user to know how much each sub-signal contributes to a precise energy level peak. The legend 1404 illustrates the pattern corresponding to each EMF sub-signal.

In operation, when the EMFDD 200 detects an energy level greater than the EMF exposition limits 1402, a timer starts and run until the EMF energy level drop lower than the EMF exposition limit 1402. If the EMF energy level drop below the EMF exposure limits 1402 before a predetermined time the timer is reset. Conversely, if the EMF energy level does not drop under the EMF exposition limit 1402 before the predetermined time of exposure expires an alarm will be generated. The alarm will indicate over exposure to EMF energy level for a predetermined amount of time. The calculation of the duration of an exposition to an above exposition limit can also be material in determining the amount of EMF received and be used by the algorithms discussed above. A loop memory can be used to continuously record EMFS and overwrite new data until a threshold is reached and the data is kept (it might be for a predetermined period of time before the threshold is reached to keep good track of what happened during the period of time before the threshold is reached).

Exemplary Methods

Figure 23:
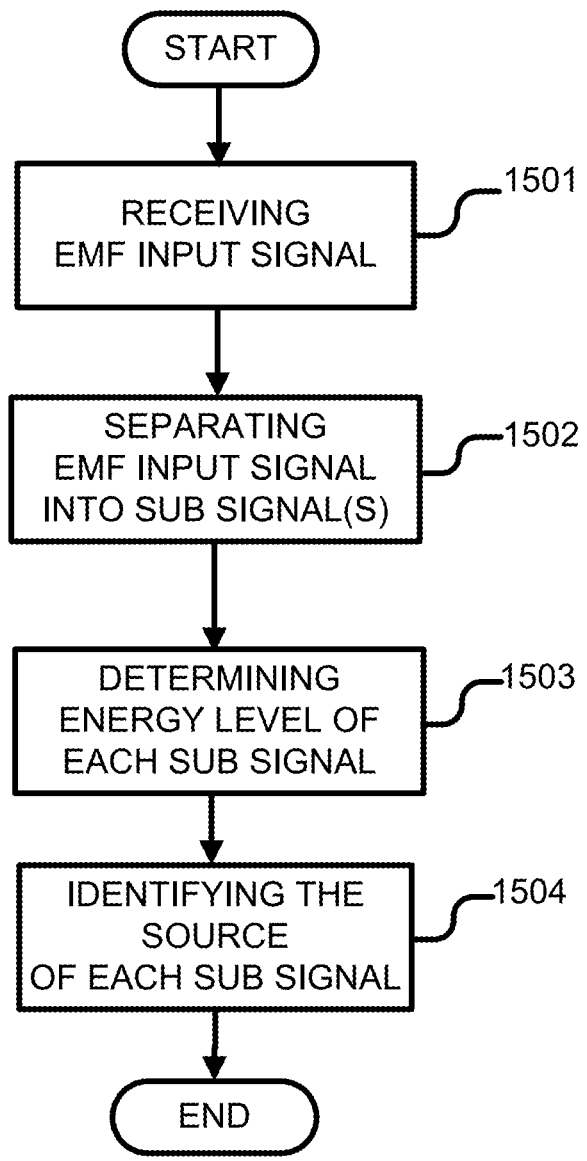
FIG. 23 is an exemplary flowchart illustrating a method in accordance with one possible embodiment of the invention.

We turn now to FIG. 23 in which a block diagram illustrates a number of steps. The method starts with the step of receiving the EMF input signal 1501, the method continues to the step of separating the EMF input signal into a plurality of sub-signal 1502. The method continues with the step of determining the energy level of each sub-signal 1503 and finally the method performs the step of identifying the EMFS 1504.

In step 1502, the processing module 202 processes the EMF input signal, using, for example, a signal processing technique such as a Fast Fourier Transform ("FFT"). The FFT may be executed on the EMF input signal at a predetermined time interval. The time interval may be every 5 ms. The FFT divides the EMF input signal into a predetermined number of bins having a predetermined resolution. Each bin represents a respective EMF sub-signal. Although each bins can further contains a plurality of EMF sub-signal coded at the same frequency range those EMF sub-signals will require further decoding to be identified.

In step 1503, the energy level of each bin is determined using the amplitude of a portion of the sub-signal. Those skilled in the art understand that the EMF energy level is proportional to each EMF sub-signal combined at that frequency. Therefore, the amplitude at that frequency may represent the energy level contribution of a plurality of EMFS 905. The step of identifying the sub-signal at that frequency will provide the information needed to assign a percentage of the EMF energy level received from different EMFS 905 at that precise frequency.

In step 1504, the identifying step tries to decode a signal signature for each sub-signal. If no signal signature is decoded, the identifying step will perform a search into a reference database of EMFS 905 containing the EMFS 905 data of a plurality of EMFS 905. If a similarity between the detected EMF sub-signal data and the EMFS 905 data in the database is found, the identification of the EMFS is made with a percentage of probability. In other words, if the step of identifying the EMFS 905 only correlate one EMF data, the identification is less reliable than when the identification was done with a plurality of correlated EMF data in relation with the EMFS 905 data. A percentage reflecting the probability of a correct identification is therefore provided.

Figure 24:
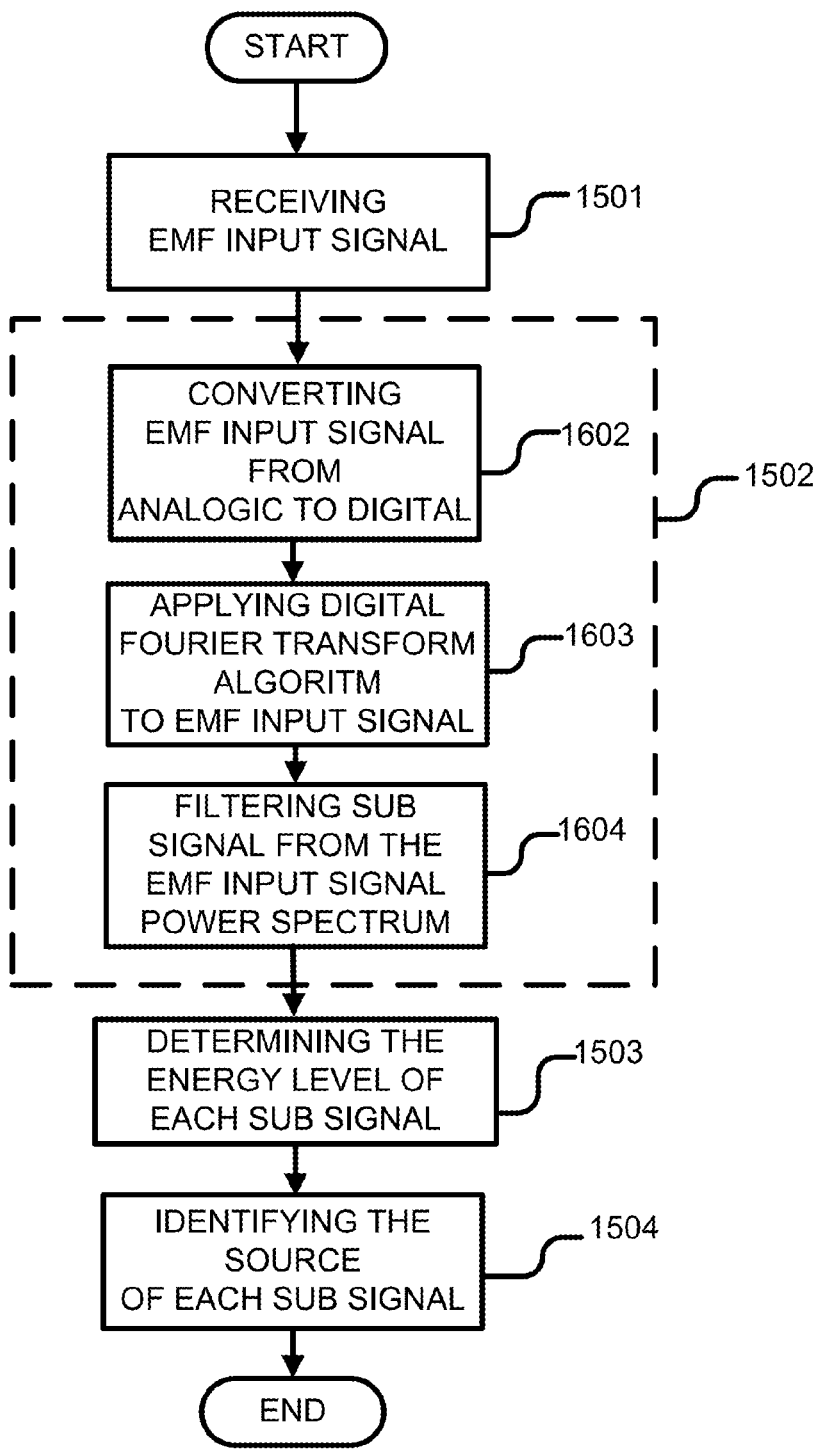
FIG. 24 is an exemplary flowchart illustrating a method for performing a digital analysis in accordance with one possible embodiment of the invention.

FIG. 24 illustrates a method analogous to the method illustrated in FIG. 23 related to the process described above, except that this time the separating step of 1502 from FIG. 23 is explained in more details and is performed in a digital mode. The step of receiving the EMF input signal 1501 remains the same, however, the following step converts the EMF input signal 1602 (i.e. to digitize the EMF analogical input signal). That step is done by a step of sampling the EMF input device at a predetermined sampling rate and quantisizing the EMF input data is performed in a subsequent step. The following step applies a Discrete-Time Fourier Transform to the digitized EMF input signal 1603. The next step separates the bins representing the sub-signals by a digital filter 1604. Then, the separated EMF sub-signals are processed to determine the energy level of each sub-signals 1503. Finally, sub-signal data, such as the frequency of the bins corresponding to each EMF sub-signal and their corresponding EMF energy level, moves to the final step of identifying the EMFS that has provided each sub-signals 1504.

Figure 25:
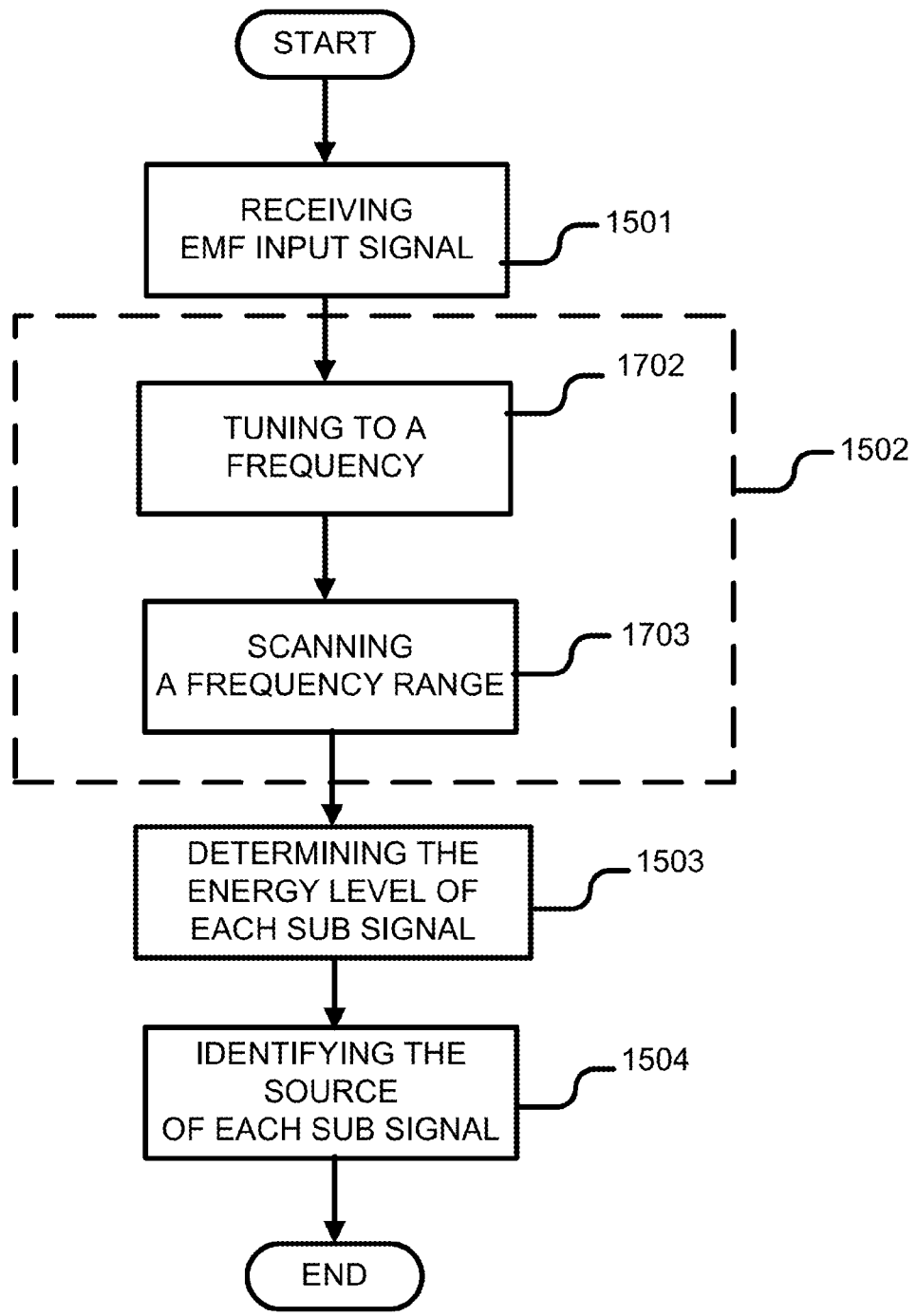
FIG. 25 is an exemplary flowchart illustrating a method for performing an analogical analysis in accordance with one possible embodiment of the invention.

FIG. 25 illustrates method analogous to the two previously described methods, with the difference that this time the method is performed in an analogical mode. Therefore, the first step consisting of receiving the EMF input signal 1501 remains unchanged, however, instead of converting the analogical EMF input signal into a digital signal like we did on 1602, the EMF input signal is filtered at a predetermined frequency 1702. A plurality of EMF sub-signals are provided by the step of scanning a frequency range 1703 that will repeatedly call the tuning step 1702 to filter all the requested frequency for separating the EMF sub-signal(s) from the EMF input signal. Each filtered EMF sub-signals will go through the determining energy level step 1503. Each sub-signal data, such as the frequency and the energy level, will be go through the step of identifying the EMFS 1504.

Figure 26:
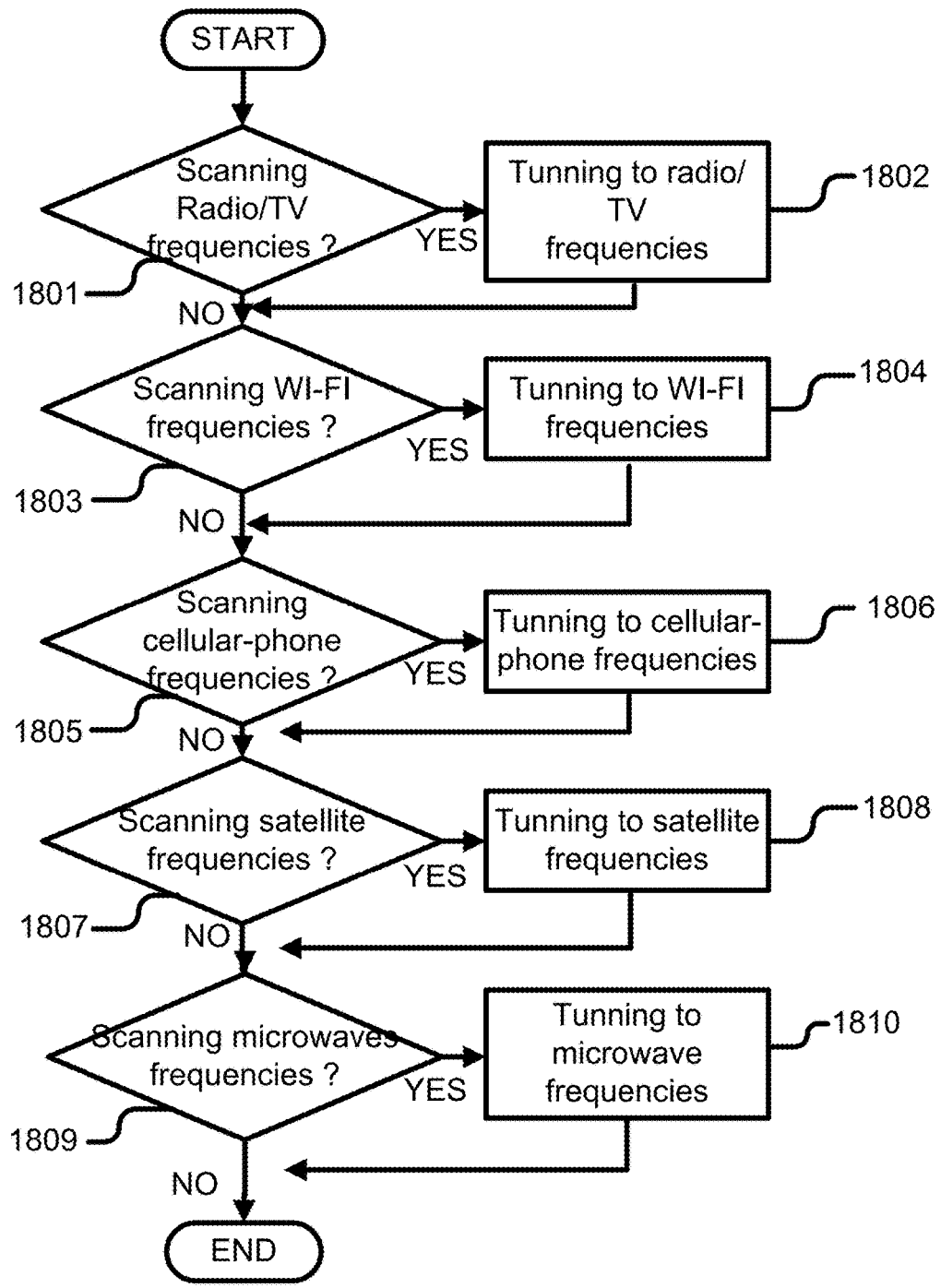
FIG. 26 is an exemplary flowchart illustrating a method for reading the EMF input signal in an analogical mode in accordance with one possible embodiment of the invention.

FIG. 26 illustrates further steps for tuning 1702 and scanning 1703 a range of frequencies as depicted in FIG. 25. The method of FIG. 26 begins with the step of determining whether the radio/TV frequency range should be scanned or not 1801. If the answer is yes, the method continues to block 1802 where the step of tuning to a plurality of radio and TV frequency range 1802 is performed. The method continues to the determination of logical block 1803. If the answer is no, the method continues to the determination of logical block 1803. The method continues with the step of making a determination as to whether the WI-FI/WiMax frequency range should be scanned or not 1803. If the answer is yes, the method continues to block 1804 where the step of tuning to a plurality of WI-FI/WiMax frequencies 1804 is performed. After that step the method continues to the determination of logical block 1805. If the answer is no, the method continues to the determination of block 1807. The method continues with the step of making a determination as to whether the mobile/cellular phone frequency range should be scanned or not 1805. If the answer is yes, the method continues to block 1806 where the step of scanning the mobile phone frequency range 1806 is performed. After that step, the method continues to the determination of logical block 1807. If the answer is no, the method continues to the determination of block 1809. The method continues with the step of making a determination as to whether the satellite frequency range should be scanned or not 1807. If the answer is yes, the method continues to block 1808 where the step of tuning the filter to a plurality of satellite frequencies 1808 is performed. After that step the method continues to the determination of logical block 1809 with the step of making a determination as to whether the microwaves frequency range should be scanned or not. If the answer is no, the method ends. If the answer is yes, the method continues to block 1810 where the step of tuning to the frequencies of the microwaves 1810 is performed.

Figure 27:
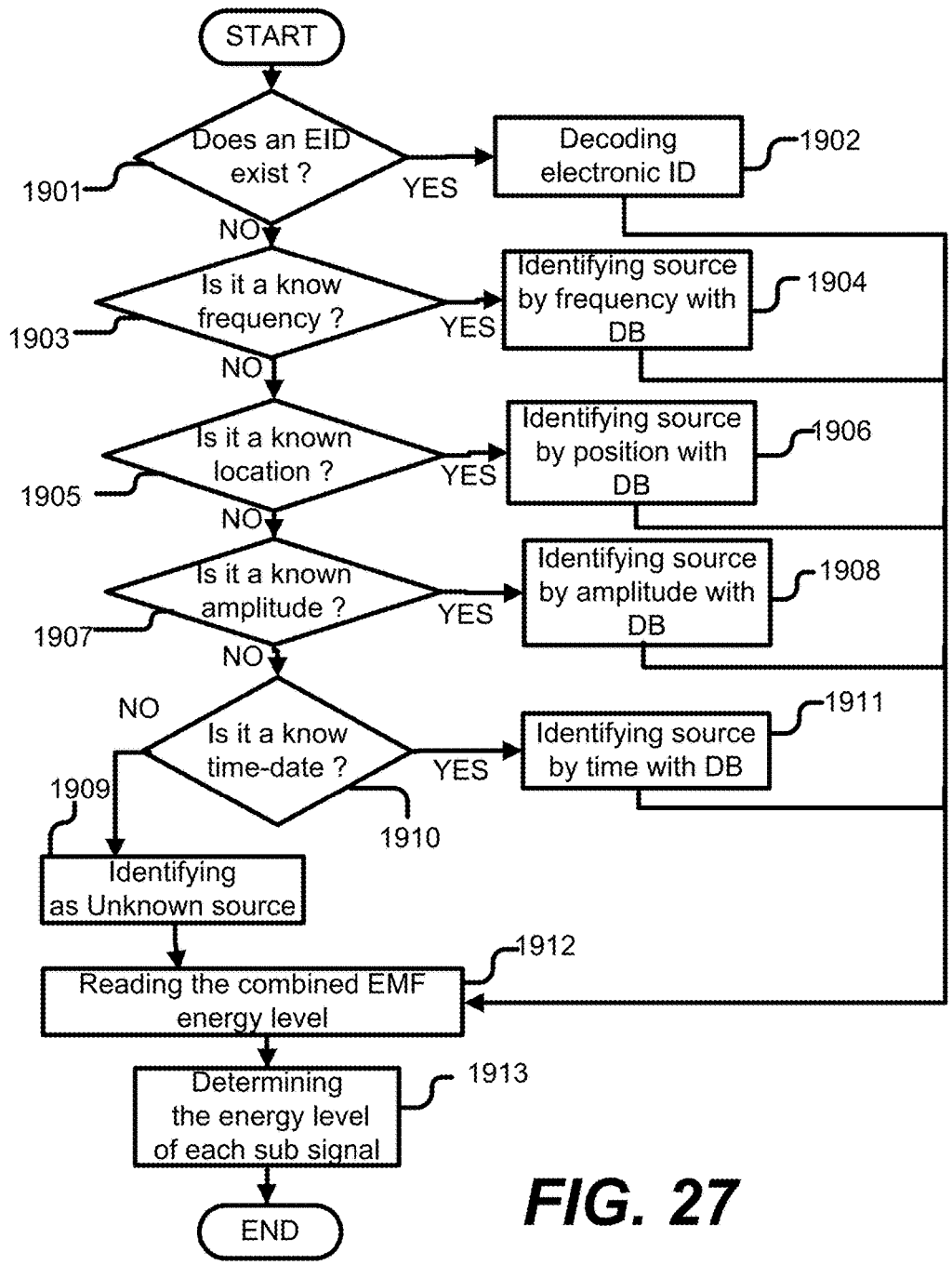
FIG. 27 is an exemplary flowchart illustrating a method for identifying the EMFS in accordance with one possible embodiment of the invention.

FIG. 27 illustrates a method adapted to be carried out by an embodiment of the identifying module 203 (illustrated on FIG. 4). The method starts with the step of determining whether a signal signature exists or not 1901. If the answer is yes, the method continues to block 1902 where the step of decoding that signal signature 1902 is performed. After that step the method continues to the determination of block 1903. If the answer is no, the method continues to the determination of block 1903. The method continues with the step of making a determination as to whether the frequency of the sub-signal is known or not 1903. If the answer is yes, the method continues to block 1904 where the step of identifying the EMFS by matching the frequencies stored in the database 1904 is performed. After that step, the method continues with the determination of block 1905. If the answer is no, the method continues with the determination of block 1905. The method continues with the step of making a determination as to whether the position of the EMFDD, when the EMFS detection occurred, is known or not 1905. If the answer is yes, the method continues to block 1906 where the step of identifying the EMFS is performed by searching a database of known locations with the actual location of the EMFDD when the EMFS detection occurred 1906. After that step the method continues with the step of making a determination as to whether the amplitude of the EMF input signal is known or not 1907. If the answer is no, the method continues with the determination of block 1910. If the answer is yes, the method continues to block 1908 where the step of identifying the EMFS is performed by searching a database of known amplitudes (correlated with known sources) with the known recorded amplitudes 1908. After that step the method continues to the determination of block 1910. If the answer is no, the method continues with the step of making a determination as to whether the date and time of the detection of the EMF data is known or not 1910. If the answer is yes, the method continues to block 1911 where the step of identifying the EMFS is performed by searching a database with the date and time as reference values 1911. After that step the method continues to the step of block 1912. If the answer is no, the method continues to the step of block 1909 illustrating the step of identifying an unknown EMFS 1909 when no previous identification step has been successful steps. The step of block 1912 is where the step of reading the absolute value of EMF input signal amplitude is performed 1912. The method then reaches the step of the block 1913, in which an evaluation is made of the contribution of each EMFS to the total amplitude of the detected EMF input signal.

Figure 28:
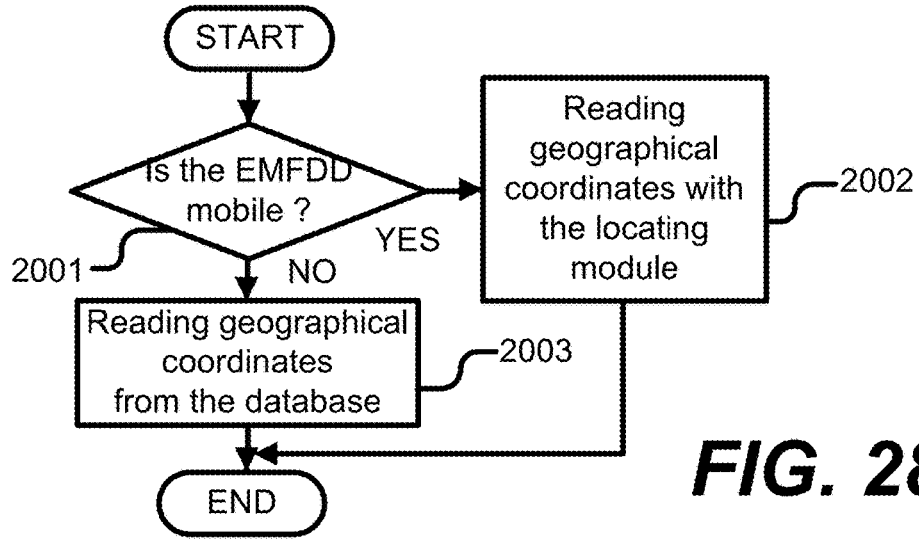
FIG. 28 is an exemplary flowchart illustrating a method for reading the geographical coordinates in accordance with one possible embodiment of the invention.
Figure 29:
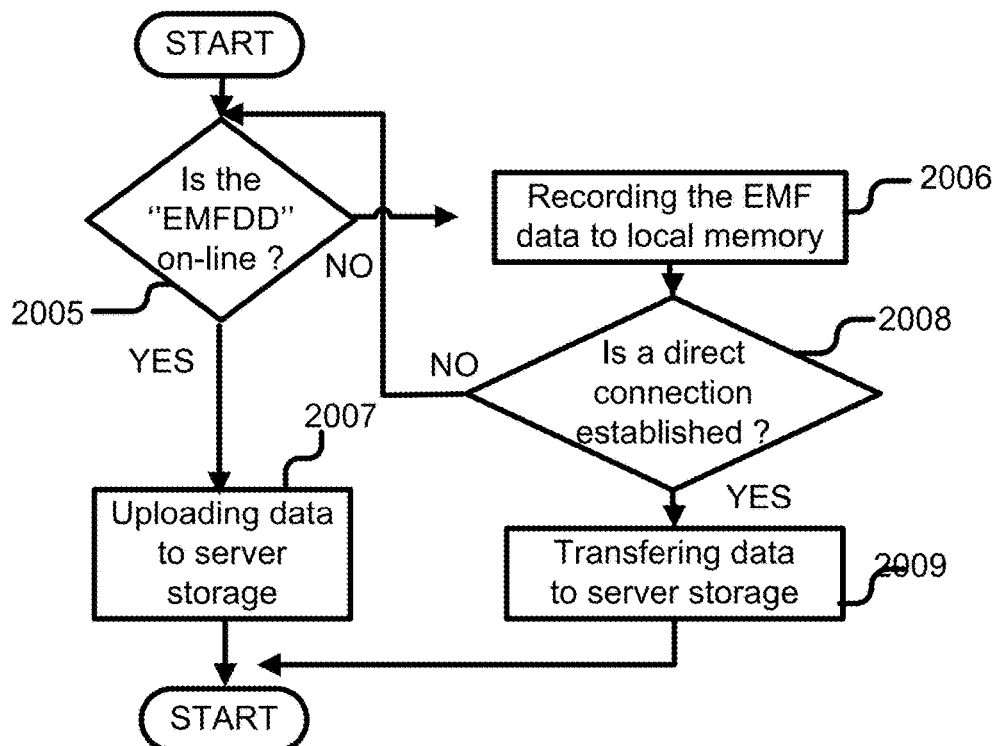
FIG. 29 is an exemplary flowchart illustrating a method for transmitting data in accordance with one possible embodiment of the invention.

FIG. 28 illustrates a method of identifying the EMFS 1504 including further steps that will provide more data associated with each EMF sub-signal. This additional data, such as reading the location of the detection event, is desirable for identifying the EMFS 905. The method begins with the step of determining whether the EMFDD 200 is portable or not 2001. If the answer is yes, the method continues to block 2002 where the step of reading the geographical coordinates with the locator module 2002 (illustratively by either a GPS receiver in an embodiment where the EMFDD 200 is embedded into the EMFDA 211 or by a triangulation method when the EMFDD is separated from the EMFDA 211) is performed. In contrast, if the answer is no, the method continues to the step of reading the geographical coordinates in the database of predetermined possible locations 2003 of the EMFDD 200. The user can select from a list of possible locations. This exemplary method is FIG. 29 illustrates the method of saving data locally when the EMFDD 200 is not connected to a network and the eventual transmission of the EMF data to a server when a connection is established. The method starts with the step of determining whether the EMFDD 200 is connected to the network or not 2005. If the answer is yes, the EMF data is uploaded to a data server 2007 and then the method terminates. If the answer is no, the method continues to the step of recording the EMF data to a locally accessible storage module 2006, then the method continues to the determination of block 2008. The method continues with the step of determining whether the EMFDD 200 is directly connected with the data server or not 2008. If the answer is yes, the method continues with the step of transferring the data directly to the data server 2009 via a serial cable for example. If the answer is no, the method continues to the determination block 2005 and repeat the sequence until the data server becomes available to the EMFDD 200.

Figure 30:
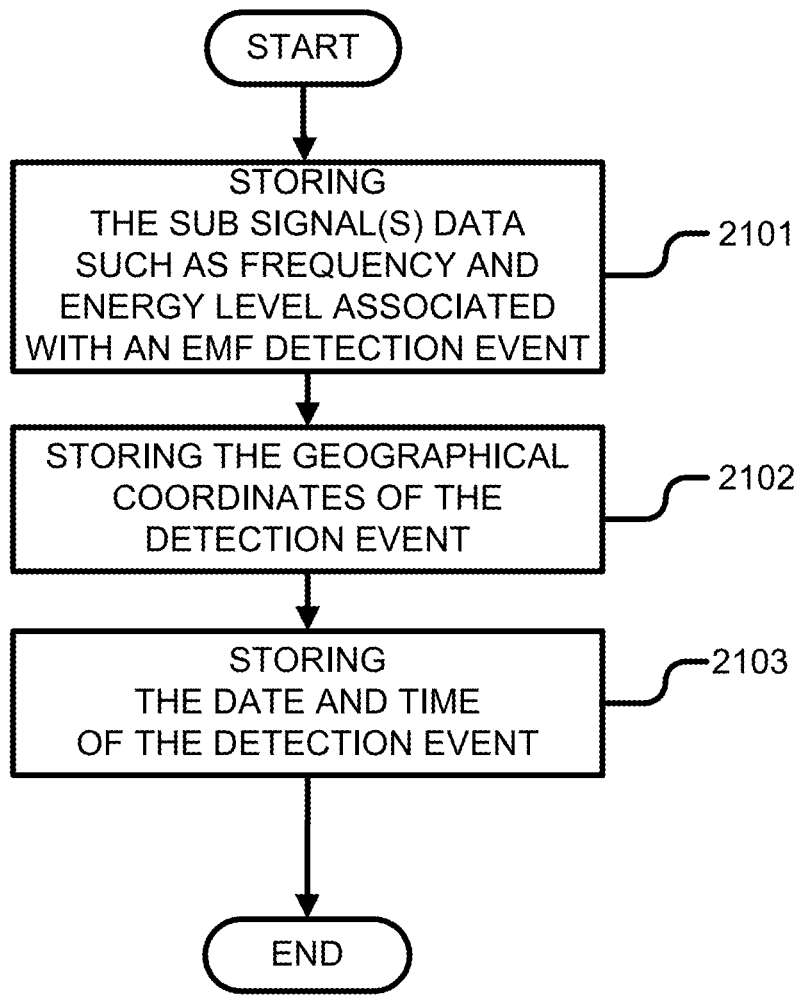
FIG. 30 is an exemplary flowchart illustrating a method for storing the EMF data in accordance with one possible embodiment of the invention.

FIG. 30 illustrates a method for storing the EMF sub-signal data. The method starts by the step of storing the EMF data 2101, then the method continues with the step of storing the geographic coordinates of the detection event 2102, then the method continues with the step of storing the time and date of the detection event 2102.

Figure 31:
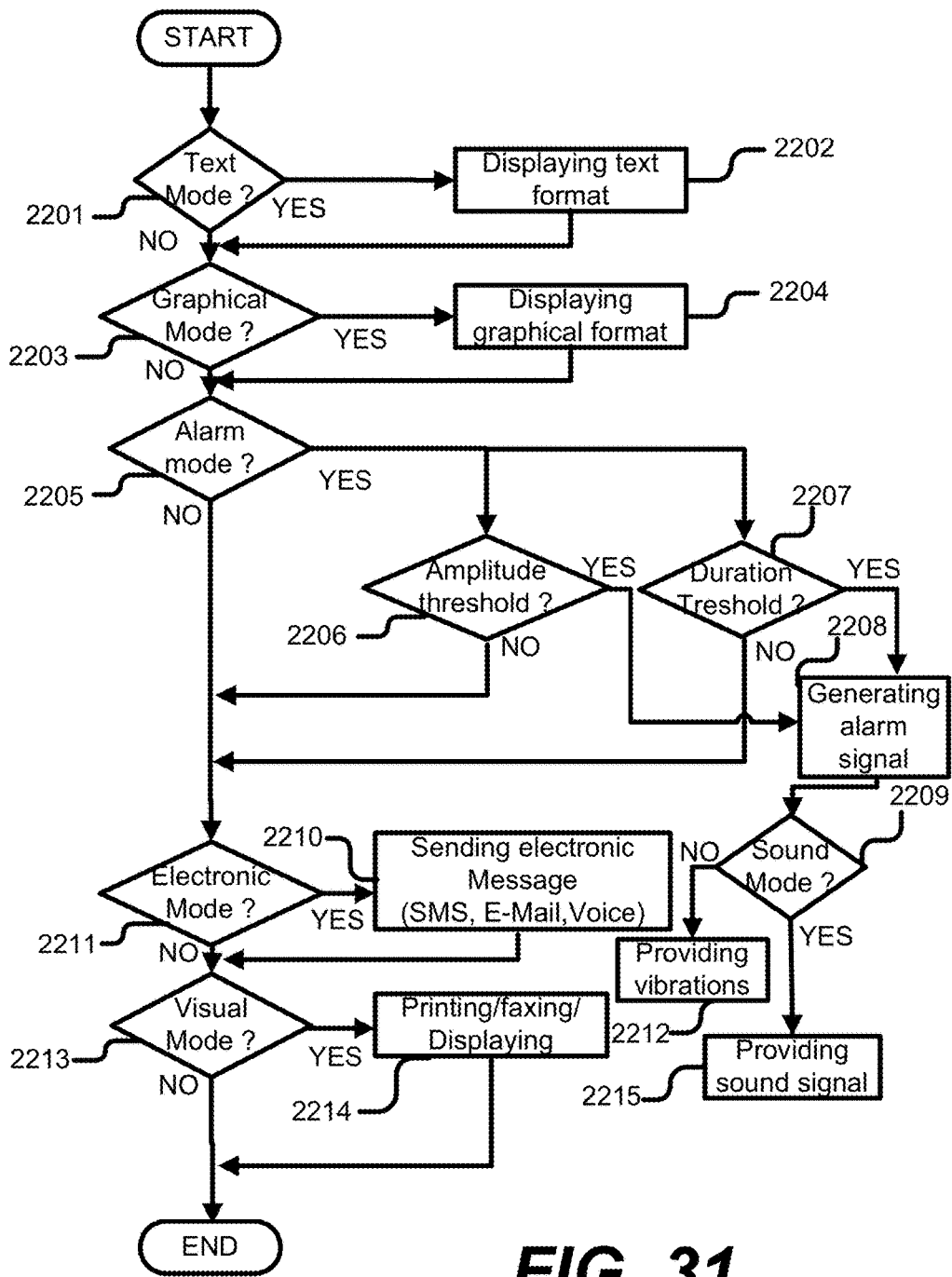
FIG. 31 is an exemplary flowchart illustrating a method for presenting the results in accordance with one possible embodiment of the invention.

FIG. 31 illustrates steps of an exemplary method of displaying the EMFDD 200 detected EMF data and the EMFS 905 in accordance with an embodiment of the present invention. The method begins with the step of determining whether the text mode was selected or not 2201. If the answer is yes, the method continues to block 2202 where the step of presenting the EMF data in text format 2202 is performed. If the answer is no, the method continues with the determination of block 2203 as to whether the graphical mode was selected or not 2203. If the answer is yes, the method continues to block 2204 where the step of displaying the EMF data in graphic format 2204 is performed. If the answer is no, the method continues with the step of making a determination as to whether the alarm mode is selected or not 2205. If the answer is yes, the method continues to the determination blocks 2206 and then 2207. Conversely, if the answer is no in the determination block 2206, the method continues to the determination of block 2211. A determination as to whether an amplitude threshold as been reached or not is made at block 2206. It the answer is yes, the method continues to block 2208. If the answer is no, the method continues to the determination of block 2211. A determination as to whether a duration threshold as been reached or not 2207 is made the method reaches the determination block 2207. A determination is made as to whether the sound mode is selected or not at the determination of block 2209. If the answer is yes, the method reaches the step of block 2215 where a sound signal is generated 2215. If the answer is no, the method continue to the block 2212 where the step of generating a vibration signal is performed 2212. Alternatively, both a sound alarm and a vibration could be produced together depending on the choice of the user. In either case, the method continues with the step of making a determination as to whether the electronic mode was selected or not 2211. If the answer is yes, the method continues to the step of sending an e-mail, a SMS or a voice message 2210 then the method reaches the determination block 2213. If the answer is no, the method continues with the step of making a determination as to whether the visual mode was selected or not 2213. If the answer is yes, the method continues to the step of printing, faxing or displaying on screen 2214 is performed, and then the method terminates. If the answer is no, the method terminates.

Figure 32:
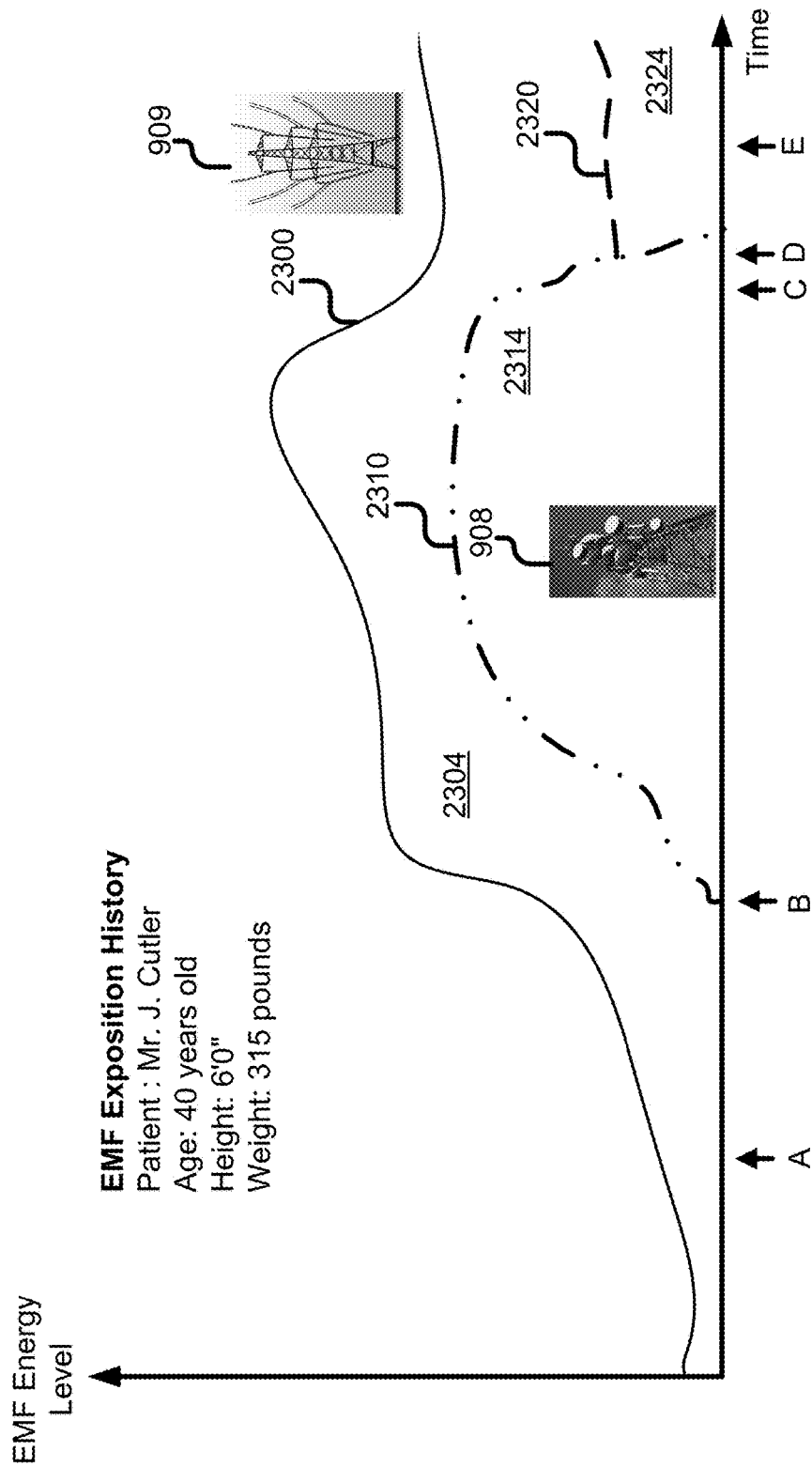
FIG. 32 is an exemplary graphical representation of the EMF exposure of an individual over time.

On a more user usability side, we are now referring to FIG. 32 illustrating an exemplary EMF energy level exposure of Mr. J. Cutler. Based on EMF data collected with an embodiment of the present invention, treated and analyzed as suggested in the exemplary embodiments of the present document. The curve 2300 represents the total amount of EMF energy level that has reached Mr. Cutler despite he had no cue he was subjected to such EMFs. Mr. Cutler had an early life without too much EMF exposure (A on the timeline). The technology progressively provided more devices using EMFs and everything became more electrified. Mr. Cutler decided to rent an apartment in Montreal, Quebec, Canada at time (B). He did not think a minute that the building in which he was going to live was equipped with mobile phone emitters/receptors thereon. In fact he thought that nothing could harm him. A significant increase in EMF Energy Level 2300 is experienced in his new apartment and mostly caused by the mobile phone generated EMF 2310. At time (C) Mr. Cutler began to feel less good, even sick, and received medical assistance to figure out he had blood cancer (leukemia) and is strongly recommended to get away from armful EMFS—especially the ones associated with his apartment. The rent is cheap and the location is convenient, Mr. Cutler is not one to listen anybody else but him but this time he felt so bad that he did move from this convenient apartment to a country house at time (D). The move had a positive effect and a drastic reduction of EMF Energy Level is observed in FIG. 32. However, the beautiful country house Mr. Cutler has bought is located next to high voltage power lines 909 and a substantial amount of EMF 2320 is still reaching him (E) at his new place.

We do not know what happened next to Mr. Cutler but we are fortunate in the present situation because Mr. Cutler has constantly wore an EMFDD in accordance with an embodiment of the present invention and the graph in FIG. 32 talks from itself. The total mount of EMF energy that has reached Mr. Cutler is equivalent to the area 2304 under the curve 2300. It is possible to see how much the cheap apartment harmed Mr. Cutler with area 2314 and how much his latest situation was better despite a significant amount of EMF 2324 from the power lines 909 and that some improvement could still be beneficial to him for furthermore reducing the amount of EMF surrounding him.

Mr. Cutler is a powerful wealthy man and, in view of his physical state, has decided to sue the company owning the cell phone transmitters 908 that were located for years on the outside wall of his cheap apartment now that it is scientifically proven that EMFs are causing, inter alia, leukemia. He intends to use the invention presented herein to establish the required proof.

Other Potentially Claimable Subject Matters

A method for determining the electromagnetic field (EMF) energy level received from a plurality of EMF sources (EMFS) and for identifying each EMFS, comprising the steps of: receiving an EMF signal; separating the EMF signal into EMF sub-signals; determining the EMF energy level of EMF sub-signals; identifying the source of each EMF sub-signals; and storing the EMF data and the EMFS identification corresponding to EMF sub-signals.

2. The method for determining the EMF energy level received from a plurality of EMFS and for identifying each EMFS of claim 1, wherein the step of separating the EMF signal into EMF sub-signals is perform by applying a Fast Fourier Transform algorithm to the EMF signal.

3. The method for determining the EMF energy level received from a plurality of EMFS and for identifying each EMFS of claim 1, wherein the step of separating the EMF signal into EMF sub-signals is perform by using at least one analogical component to separate the EMF signal.

4. The method for determining the EMF energy level received from a plurality of EMFS and for identifying each EMFS of claim 1, wherein the step of identifying the EMFS is performed by using identification information decoded in the EMF sub-signal.

5. The method for determining the EMF energy level received from a plurality of EMFS and for identifying each EMFS of claim 1, wherein the step of identifying the EMFS comprises correlating an EMFS database.

6. The method for determining the EMF energy level received from a plurality of EMFS and for identifying each EMFS of claim 1, wherein the step of determining the EMF data comprises locating the EMF device location with a locating module.

7. The method for determining the EMF energy level received from a plurality of EMFS and for identifying each EMFS of claim 1, wherein the step of determining the EMF location of the EMF data is performed by triangulation of EMFS location.

8. The method for determining the EMF energy level received from a plurality of EMFS and for identifying each EMFS of claim 1, wherein the step of storing the EMF data corresponding to EMD sub-signal is performed by storing the EMF data and EMFS identification corresponding to EMF sub-signals in a recording medium accessible on a network.

9. The method for determining the EMF energy level received from a plurality of EMFS and for identifying each EMFS of claim 1, further comprising the step of providing a warning when the EMF energy level has reached a predetermined threshold.

10. The method for determining the EMF energy level received from a plurality of EMFS and for identifying each EMFS of claim 1, further comprising the step of providing a warning when the exposition time to an EMF having more than a predetermined EMF energy level has reached a predetermined duration threshold.

11. The method for determining the EMF energy level received from a plurality of EMFS and for identifying each EMFS of claim 1, further comprising the step of displaying EMF data on a map.

12. The method for determining the EMF energy level received from a plurality of EMFS and for identifying each EMFS of claim 1, further comprising the step of displaying a chronological history of EMF data.

13. The method for determining the EMF energy level received from a plurality of EMFS and for identifying each EMFS of claim 1, wherein the step of identifying the EMFS comprises using interpolated values of EMF data.

14. The method for determining the EMF energy level received from a plurality of EMFS and for identifying each EMFS of claim 1, wherein the step of receiving EMF signal comprises using more then one receiving module.

15. A user graphical interface comprising: an area adapted to illustrate the energy level of EMFS in relation with geographical locations.

The description and the drawings that are presented above are meant to be illustrative of the present invention. They are not meant to be limiting of the scope of the present invention. Modifications to the embodiments described may be made without departing from the present invention, the scope of which is defined by the following claims.

What is claimed is:

1. A method of informing persons of potentially harmful electromagnetic fields, and their sources, to which they may be exposed within a geographical area, the method comprising:

receiving and recording, EMF-related data from each of a plurality of devices carried or worn by individuals during normal life activities over time, each respective device of the plurality of devices comprising:

a receiving module adapted to receive an EMF input signal to which an individual carrying or wearing the respective device is exposed, the EMF input signal including EMF sub-signals generated by one or more EMF generating devices;

a processing module operatively connected to the receiving module and adapted to separate the received EMF input signal, to which the individual carrying or wearing the respective device is exposed, into the EMF sub-signals; to identify energy levels of the EMF sub-signals; and, for each EMF sub-signal having an energy level above a predetermined energy level, to identify an EMF source corresponding to such EMF sub-signal, including for at least one such EMF sub-signal digitally decoding an electronic signature;

a time-date module operatively connected to the processing module and adapted to associate a time-date associated with the received EMF input signal to which the individual carrying or wearing the respective device is exposed; and a location module operatively connected to the processing module and adapted to identify a location associated with the received EMF input signal to which the individual carrying or wearing the respective device is exposed, wherein the EMF-related data that is received comprises the identified location, the associated time-date, and at least one of the identified energy level, frequency, and EMF source corresponding to a separated EMF sub-signal;

the method further comprising:

identifying electromagnetic fields, sources of the electromagnetic fields, and energy levels of the electromagnetic fields to which the individuals were exposed within a geographical area based on the identified locations in the EMF-related data received from the plurality of devices carried or worn by the individuals, and displaying a graphical representation of energy levels of electromagnetic fields sources of electromagnetic fields within the geographical area based on the identified electromagnetic fields, identified sources of the electromagnetic fields, and identified energy levels of the electromagnetic fields to which the individuals were exposed within a geographical area.

2. The method of claim 1, further comprising providing historical EMF energy levels at particular locations within the geographical area.

3. The method of claim 1, further comprising extrapolating a future EMF energy level a particular location within the geographical area.

4. The method of claim 1, further comprising sending a message to a device on a basis of an EMF energy level characteristic.

5. The method of claim 4, wherein the characteristic is selected from a group consisting of an EMF duration and an EMF power.

6. The method of claim 1, wherein the plurality of devices comprises a personal apparatus having a size and configuration for carrying or wearing by an individual.

7. The method of claim 1, wherein the plurality of devices comprises a mobile phone.

8. The method of claim 1, wherein the EMF-related data that is received from each of the plurality of devices is recorded at a server with the EMF-related data being stored for and in association with a plurality of persons such that the EMF-related data can be accessed later for providing a historical record of the EMF environment of each person over time.

9. The method of claim 1, wherein the EMF-related data is received from each of the plurality of devices over the Internet.

* * * * *